(12) United States Patent
Etoh

(10) Patent No.: US 7,031,556 B1
(45) Date of Patent: Apr. 18, 2006

(54) ULTRAHIGH SPEED IMAGE PICKUP DEVICE

(75) Inventor: Takeharu Etoh, 21-2, Aomatanihigashi 7-chome, Mino-shi, Osaka 562-0022 (JP)

(73) Assignees: Takeharu Etoh, Osaka (JP); Shimadzu Corporation, Kyoto (JP)

( * ) Notice: Subject to any disclaimer, the term of this patent is extended or adjusted under 35 U.S.C. 154(b) by 865 days.

(21) Appl. No.: 10/089,601

(22) PCT Filed: Sep. 28, 2000

(86) PCT No.: PCT/JP00/06700

§ 371 (c)(1),
(2), (4) Date: Apr. 29, 2002

(87) PCT Pub. No.: WO01/24270

PCT Pub. Date: Apr. 5, 2001

(30) Foreign Application Priority Data

Sep. 30, 1999 (JP) ................................. 11/377473

(51) Int. Cl.
*G06K 7/00* (2006.01)

(52) U.S. Cl. ...................... 382/312; 382/313; 382/318; 382/321

(58) Field of Classification Search ................ 382/312, 382/313, 318, 321; 348/162, 222.1, 227.1, 348/311; 257/458, 436, 678, 686; 438/384, 438/485, 487, 503; 118/723 E, 718; 194/207
See application file for complete search history.

(56) References Cited

U.S. PATENT DOCUMENTS

| 5,294,290 A | * | 3/1994 | Reeb .............................. 216/6 |
| 5,355,165 A | | 10/1994 | Kosonocky et al. ........ 348/311 |
| 5,991,467 A | * | 11/1999 | Kamiko ...................... 382/312 |
| 6,765,609 B1 | * | 7/2004 | Kinoshita ................ 348/222.1 |

FOREIGN PATENT DOCUMENTS

JP 11-225288 A 8/1999

OTHER PUBLICATIONS

Walter F. Kosonocky, et al., "360×360-Element Very-High Frame-Rate Burst-Image Sensor", Digest of Technical Papers ISSCC96, pp. 182-183, 1996.

Takeharu Etoh: "4500-Per-Frame High-Speed Video Camera", Journal of the Institute of Image Information and Television Engineers, vol. 46, No. 5, 1992, pp. 543-549.

Takeharu Etoh et al.: "Improved Design of an ISIS type for a Video Camera of 1,000,000 pps", Proceedings of High-Speed Imaging and Sequence Analysis, SPIE vol. 3642, 1999 pp. 127-132.

* cited by examiner

*Primary Examiner*—Anh Hong Do
(74) *Attorney, Agent, or Firm*—Birch Stewart Kolasch & Birch LLP

(57) ABSTRACT

An ultra-high speed image sensor is a frame transfer type. A charge corresponding to an intensity of a incident ray is generated at an element of a charge transfer path corresponding to each window. The generated charge is transferred on the charge transfer path by voltages applied from the charge transfer electrodes to. Each of the charge transfer electrodes to has a larger size in a charge transfer direction at portions corresponding to the window than that at portions covered with the intercepting film.

4 Claims, 26 Drawing Sheets

ULTRAHIGH SPEED IMAGE PICKUP DEVICE

This application is the national phase under 35 U.S.C. § 371 of PCT International Application No. PCT/JP00/06700 which has an International filing date of Sep. 28, 2000, which designated the United States of America.

TECHNICAL FIELD

The present invention relates to an image sensor for ultrahigh-speed image capturing suitable for continuous image capturing of high-speed motions such as breakage and explosion of materials and high-speed flows.

BACKGROUND ART

The speed of image capturing by normal solid-state image sensors is limited by the information transfer capability of a read-out line for reading out image information from the image sensor to the outside of the image sensor. Precisely, the image capturing speed is limited by the information processing capabilities of an output circuit that performs processing preceding the image information read-out and an AD converter that performs processing succeeding the image information read-out, that is, a sampling rate. A standard maximum sampling rate of currently used image sensors is approximately 25 MHz (25,000,000 pixels per second) in 8-bit conversion. For example, when the image information of one hundred thousand or one million pixels arranged on the image capturing area is read out through one read-out line, the upper limit of the image capturing speed is 250 frames per second (25,000,000/1,000,000) or 25 frames per second (25,000,000/1,000,000).

The following two methods have been employed to enhance the speed of image sensors.

One method is to maximize the number of sets of a read-out circuit, a read-out line and an AD converter. The image sensors employing this method are called parallel read-out image sensors. The present inventor has already provided a video camera having a parallel read-out image sensor with 16 read-out lines. The image capturing speed of this video camera is 4,500 frames per second in the case of 256×256 pixels (for example, see Takeharu ETOH, "4500-Per-Frame High-Speed Video Camera", Journal of the Institute of Image Information and Television Engineers, Vol. 46, No. 5, 1992, pp. 543–549).

The other method is to provide, on the periphery of each pixel, an area where a multiplicity of pieces of image information can be stored, continuously store image information in the image sensor without reading out the image information to the outside of the image sensor during image capturing, and read out the image information with leisure after image capturing is finished. The present inventor calls the image sensors employing this method In-situ Storage Image Sensors (ISISs). Since the ISISs record image information with all the pixels in parallel, ultimate ultrahigh-speed image capturing is possible. For example, in the case of 256×256 pixels where image information is recorded through parallel processing of 65, 536 (256×256), incommensurably high-speed image capturing is possible compared to the parallel read-out from 16 lines.

The present inventor and others have already developed and proposed some ISIS image sensors (for example, see Takeharu ETOH et al., "Improved Design of an ISIS type for a Video Camera of 1,000,000 pps", Proceedings of High-Speed Imaging and Sequence Analysis, SPIE Vol. 3642, 1999, pp. 127–132).

Many of these ISIS type image sensors use CCDs (charge-coupled devices) as image information storage means.

Normal CCD image sensors are broadly divided into an interline transfer CCD image sensor 10 (referred to as IT-CCD image sensor) shown in FIG. 17 and a frame transfer CCD image sensor 11 (referred to as FT-CCD image sensor) shown in FIG. 18.

In the IT-CCD image sensor, photoelectrical converters 12 (photodiodes are normally used) that convert light to electrical charge and charge transfer paths 13 (storage portions) comprising CCDs are separately disposed on a horizontal plane. Light is intercepted from the charge transfer paths 13 by a non-illustrated intercepting film. Input gates 14 are interposed between the photoelectrical converters 12 and the charge transfer paths 13. The charge generated at each photoelectrical converter 12 in accordance with the intensity of the incident light is transferred to the charge transfer path 13 through the input gate 14. Since the aperture efficiency (the ratio of the area of the non-light intercepted portion of the window with respect to the area of the entire light receiving portion) is decreased due to the provision of the intercepting film, microlenses are attached above the windows to increase the substantial aperture efficiency.

In the FT-CCD image sensor, the charge transfer paths 13 also perform as photoelectrical converters on an image capturing area 15. Non-illustrated transparent electrodes are attached above the charge transfer paths 13, and the charges generated by the light incident through the transparent electrode are transferred by changing the voltages applied to the transparent electrodes. However, since charges are continuously generated according to the incidence of the light during the charge transfer, a light intercepted image information storage area 16 comprising a CCD and corresponding to one frame is provided in a lower part of the image capturing area 15. At the time of image capturing, after exposure is performed for a predetermined time, image information of one frame is transferred from the image capturing area 15 to the image information storage area 16 at an extremely high speed, and the image information is read out to the outside of the image sensor with leisure during the subsequent exposure. The FT-CCD image sensor may be constructed of only a simple CCD. Moreover, since light is incident also on the charge transfer paths 13, the aperture efficiency is high, and therefore, it is unnecessary to attach a microlens.

As described above, the FT-CCD image sensor is simpler in structure than the IT-CCD image sensor because of unnecessity of the input gates and the microlens. For this reason, early CCD image sensors are of the FT-CCD type.

However, the FT-CCD image sensor, which captures incident light through the transparent electrode, is low in the sensitivity to the light in the wavelength range readily absorbed by the transparent electrode. Normally, the transparent electrode is made of polysilicon, and however thin it may be, it largely absorbs blue light with short wavelengths. In addition, since light is incident also during the charge transfer, a so-called smearing, in which portions of an image corresponding to high light-intensity are captured as longitudinally elongated lines, is remarkable. To prevent the smearing, it is necessary to take an artifice such as provision of a mechanical or electrical high-speed shutter for intercepting incident light during the charge transfer on the front surface of the image sensor. Since these problems are significantly improved in the IT-CCD image sensor, many of the recent CCD image sensors are of the IT-CCD type or an improved IT-CCD type.

With respect to the ISIS, the following image sensors are both based on the IT-CCD type: a CCD image sensor shown in FIG. 19 developed by Kosonocky et al. (see F. W. Kosonocky et al., "360×360-Element Very-High Frame-Rate Burst-Image Sensor", Digest of Technical Papers, ISSC 96, 1996, pp. 182–183); and an image sensor shown in FIGS. 20 and 21 that the present inventor has already proposed (for example, see the above-mentioned document of Takeharu ETOH and three others) Specifically, in these image sensors, each pixel has a large-size photodiode 115 and a CCD type recording portion 135 having a multiplicity of small charge accumulation elements on a side of the photodiode 115. The photodiode 115 and the recording portion 135 are interconnected by an input gate 114.

On the other hand, the FT-CCD type can be used as the basic structure as shown in FIG. 22. In the FT-CCD image sensor shown in FIG. 22, the entire area of the photoreceptive of the FT-CCD image sensor of FIG. 18 is covered with an intercepting film 17, and in the intercepting film 17, windows 18 through which light passes are formed so as to be staggered. Fifteen CCD elements 19b to 19d below each window 18 can be used as image information storage portions because they are covered with the intercepting film. That is, the image information (charge) of a first image generated at the CCD element 19a corresponding to each window 18 is first accumulated in the CCD element 19b immediately below the window 18. Then, the image information of a second image generated at the CCD element 19a corresponding to each window 18 is stored in the CCD element 19b immediately below the window 18 at the same time when the first image information is transferred to the CCD element 19c one row below. By repeating similar processes, image information of fifteen continuous frames is stored in the CCD elements 19b to 19d. After the shutter provided on the front surface of the image sensor is closed, the image information is transferred one after another in a vertical direction as in the normal FFT-CCD image sensors, and the stored image information can be read out one after another with leisure from a read-out circuit through a horizontal CCD provided outside the photoreceptive area. When the FT-CCD image sensor shown in FIG. 22 is employed as the basic structure, the structure of the image sensor is sufficiently simple compared to when the IT-CCD image sensor shown in FIGS. 19 to 21 is employed as the basic structure, so that the manufacturing cost can be reduced and noise can be suppressed.

In FIG. 22, the windows 18 are not arranged so as to form squares. On the other hand, by arranging windows 18 as shown in FIG. 23 and slanting the image capturing area with a gradient of 4:1, the windows 18 form a square arrangement. In this case, the basic axes 36 for designing the CCD and the orthogonal axes 37 of pixel arrangement interconnecting the centers of the windows 18 obliquely intersect with a gradient of 4:1. With the structure of FIG. 23, ISISs of orthogonal pixel arrangement can be easily realized (see Japanese Laid-Open Patent Application No. 2000-268010).

In high-speed image capturing, it is difficult to perform image capturing in exact timing with the occurrence of a phenomenon. For example, although the image sensor of FIG. 22 is capable of continuously image capturing fifteen images, when image capturing is performed at intervals of $1/_{1,000,000}$ second with the image sensor, image capturing is finished in $15/_{1,000,000}$ second. Therefore, a shift of timing of only $15/_{1,000,000}$ second makes it impossible to capture the target phenomenon.

An example of means for solving this problem is serial overwrite image capturing. The serial overwrite imaging is started before the target phenomenon occurs, and finished immediately after the occurrence of the phenomenon is confirmed. The recorded image information is read out retroactively. Comparing a method in which the occurrence of a phenomenon is predicted and image capturing is started immediately before the occurrence and a method in which image capturing is finished after the occurrence of the phenomenon is confirmed, the latter method is by far easier.

To realize this, for example, a drain 38 is provided in the CCD element immediately above each window 18 as shown in FIG. 23. The drains 38 are set so as to function during image capturing and not to function during the information read-out performed after image capturing.

The drains of normal CCD image sensors have roughly two purposes. One is an overflow drain function of making the excessive charge generated by excessive incident light automatically overflow to the outside of the sensor in order to prevent blooming that the excessive charge overflows to surrounding pixels. The other is a simultaneous discharging function of simultaneously discharging the temporarily stored charge to the outside of the image sensor every charge transfer stage. This function is employed, for example, for preventing smearing due to incomplete charge transfer from the photodiode to the CCD transfer path.

In ISISs, drain function for serial overwriting is further added to these. Drains for serial overwriting are a kind of simultaneous discharging drain in structure. However, while electronic shutters and drains for smearing-prevention function every charge transfer step, serial overwriting drains in ISISs are activated immediately before the start of image capturing, held activated during image capturing, and deactivated immediately after the end of image capturing.

Since these drain functions are also very important in ISISs, existing technologies regarding drains will be concretely described. Examples of the drain structure include a vertical drain structure and a horizontal drain structure.

In the vertical drain for the FT-CCD image sensor, electrodes are provided above the CCD elements in the uppermost row of the light intercepted image storage area 16 (39 in FIG. 18). A high voltage is applied to the electrode to thereby transmit charge vertically below the CCD transfer paths, resulting in that the charge is discharged from the rear surface of the chip of the image sensor. The time necessary for merely simultaneously transferring the image information of one frame vertically downward within the image capturing area is sufficiently short compared to the time for storing charges, that is, the time necessary for reading out all of the image information of one frame. The read-out needs long time because image information is read out from the storage portion pixel by pixel after the frame transfer. Therefore, charges can be substantially simultaneously discharged by providing one row of drains on the lower side of the photoreceptive area.

In the vertical drain for the IT-CCD image sensor, a high negative voltage is applied to the chip rear surface, and charge is discharged to the chip rear surface from a portion where a potential barrier is weak, which portion is formed on the lower surface of each photodiode.

On the other hand, in the horizontal drain, the drain is disposed so as to adjoin the charge transfer path or the photodiode, and a potential barrier is interposed therebetween so that no charge flows into the drain in normal phases. When a voltage is applied to the electrode disposed above the potential barrier, the potential barrier decreases, so that charge is discharged from the charge transfer path or the photodiode into the drain on a side thereof. The charge discharged into the drain is further discharged to the outside of the sensor through an electrical wire disposed above the drain. Alternatively, charge may be discharged from the chip rear surface to the outside of the sensor through a portion, immediately below the drain, where the potential barrier is weak.

The drain can be used as an electronic shutter by turning on and off the high voltage applied to the electrode for the drain at an appropriate timing.

By providing a drain 38 in a CCD element 40 immediately above each window 18 as shown in FIG. 23, the information of the image captured at proceeding 16 steps is always continuously discharged from the drain 38 to the outside of the image sensor during image capturing, and the image information corresponding to latest 15 frames is always recorded in a CCD accumulation element.

After image capturing is finished, the shutter provided on the front surface of the image sensor is closed, the application of the drain voltage is stopped so that the drain function is deactivated, and then, the image information stored in the sensor is read out to the outside of the image sensor by a normal CCD operation.

It should be noted that in case of the drain for serial overwriting, a condition where the drain functions is maintained during image capturing whereas a condition where the drain does not function is maintained after image capturing is finished. Concretely, electrodes for activating and deactivating the drain function and power transmission means for transmitting a voltage for the activation and deactivation are newly required. The activation and deactivation are performed not during image capturing but only immediately before and after image capturing.

Normally, disposition of one layer of metal wires or polysilicon wires on the surface of the image sensor is necessary for operating the voltages transmitted to the electrode. By applying the voltages to the drain electrodes through these wires, charges are discharged from the rear surface of the image sensor through the drain. The addition of one layer of wires is an enormous load because the smaller the number of conductive films for forming electrodes on the image sensor, the easier the design and fabrication are.

In the case of the vertical drain, since the voltage is normally applied from the chip rear surface, it is unnecessary to further provide a wiring on the chip surface. However, since the drains for these purposes including the drain for the electronic shutter serving the three purposes of simultaneous discharging, drain for overflow, and drain for serial overwriting have different operations and positions of placement from one another, it is difficult to realize all the three functions only with the activation and deactivation of the voltage applied to the chip rear surface and the voltage level control. If the vertical drain control voltages can be transmitted not only from the rear surface of the chip but also from the upper surface thereof, it will become by far easy to control these functions in combination.

DISCLOSURE OF INVENTION

The biggest problem of the image sensor of FIG. 22 is a low aperture efficiency. In the case of FIG. 22, the aperture efficiency is only $\frac{1}{16}$, namely 6.25%. Further, when the number of continuous images is set to 100 in the structure of FIG. 22, the aperture efficiency is as low as 1% ($\frac{1}{100}$).

As a solution to this problem, it might be considered to longitudinally elongate windows 55 as shown in FIG. 24. However, this construction causes following two problems.

In the example of FIG. 24, CCD elements 56a to 56d correspond to each window 55, and image information is not stored until the charges generated at the four elements within the exposure time are transmitted to CCD elements 56e to 56f of the light intercepted image information storage portion. In other words, the charges need to be transferred through four CCD elements 56 to perform information storage for each one of images, and four CCD elements 56 are required for storing image information corresponding to each one of images. Therefor, first, the transfer rate is ¼ that in the case of FIG. 22. Second, the number of images that can be stored is reduced to ¼.

To solve this problem, it might be considered to provide one elongated CCD element 72 for each elongated window 55 as shown in FIG. 25 and transfer image information with a large pitch. However, the too long CCD elements cause a problem in the charge transfer. That is, as shown in FIG. 26, in normal CCDs, when voltages are applied to adjoining electrodes 73, 74 and 75 in three steps, the potential distribution in the CCD transfer path is not an ideal stepwise potential distribution 76 but is a potential distribution 77 having milder corner portions of the steps. The effect of milder corner is called a field fringing effect. Since this causes a potential gradient in the transfer direction, the transfer rate is much higher than in the case of the ideal stepwise potential distribution 76 where the flat part is long.

In the CCD element 72 extremely elongated as shown in FIG. 25, a long flat part is formed in the potential gradient and the time for the charge to move therethrough increases, thereby the transfer rate decreases. Under some design conditions and manufacture conditions, a part where a negative potential gradient is caused in the charge transfer direction to trap charges or a potential pocket is formed. In the case of FIG. 25, even if a small potential pocket may possibly be formed for some reason, it is eliminated by the field fringing effect. However, if the CCD pitch is too large, the length where the field fringe functions relatively decreases, and such an effect cannot be expected.

The other problem is how to newly add the drain for serial overwriting in addition to the normal drain without complicating the structure. If not only voltage from the chip rear surface but also the drain control voltage can be transmitted from the chip upper surface to activate and deactivate the drain for serial overwriting, the design and the operation of the drain will become easy.

In view of the above-mentioned problems of the conventional image sensors, an object of the present invention is to provide an image sensor, simple in structure and capable of ultrahigh-speed image capturing based on the FT-CCD image sensor.

To solve the problems, a first aspect of the present invention provides an image sensor for ultrahigh-speed image capturing comprising: a plurality of charge transfer paths each constituted by a charge coupled device having a plurality of elements and disposed parallel to each other; a plurality of charge transfer electrodes intersecting the charge transfer paths and provided for each element of the charge transfer paths; an intercepting film covering the charge transfer paths and said charge transfer electrodes so as to intercept an incident ray; and a plurality of windows provided in the intercepting film and allowing the incident ray to pass therethrough, wherein a charge corresponding to an intensity of the incident ray is generated at the element of the charge transfer path corresponding to each window, and the generated charge is transferred on the charge transfer path by voltages applied from the charge transfer electrodes, and wherein each of the charge transfer electrodes has a larger size in a charge transfer direction at portions corresponding to the windows than that at portions covered with the intercepting film.

Due to the frame transfer type, the image sensor for ultrahigh-speed image capturing is simpler in basic structure than the interline transfer type. Moreover, since each of the charge transfer electrodes has a larger size in a charge transfer direction at portions corresponding to the windows than that at portions covered with the intercepting film, the aperture efficiency is high. Further, charges can be transferred with a large pitch, so that the charge transfer rate in the windows or the image capturing speed is high. In addition, the number of elements at each window decreases in inverse proportion to the ratio of the width of the charge transfer electrode, the number of elements necessary for accumulating one image decreases, and the number of images that can be stored in the sensor increases. As described above, in the image sensor for ultrahigh-speed image capturing of the first aspect of the present invention, the basic structure is simple, the aperture efficiency is comparatively high, image capturing can be performed at a higher speed, and a large number of continuous frames can be captured.

Preferably, the portions of each charge transfer electrode corresponding to the windows have upstream and/or downstream sides in the charge transfer direction, the upstream and/or downstream sides intersecting with respect to a direction in which the charge transfer paths extend at angles other than perpendicular to the direction.

In this case, since the length of the upper and/or the lower sides increases and thereby the area where the field fringe effect is caused increases, the transfer rate increases and a potential pocket can be prevented from being caused in the transfer path. By the upper and/or the lower side being wedge-shaped, wavy, comb-shaped or the like, the side length is extremely long, so that the area where the field fringe effect is caused can be further increased.

Preferably, the intercepting film is made of a conductive material. The image sensor further comprises: discharging means provided for each charge transfer path, the number of said discharging means being the same as the number of the windows through which the charge transfer path passes; and a voltage supply for supplying a drive voltage to the discharging means through the intercepting film. The drive voltage is supplied from the voltage supply to the discharging means to hold said discharging means activated during image capturing, whereas the supply of the drive voltage from said voltage applying means to said discharging means is stopped to hold said discharging means deactivated while the image capturing is stopped.

In this case, since the intercepting film is used as a drain voltage control conductive film, introduction of a new conductive film can be avoided. Specifically, since the intercepting film has an extremely large area and a large electric capacity, it is difficult to apply to this voltages that suddenly change for electronic shuttering. Moreover, since the intercepting film covers substantially the entire area of the image capturing area, the image quality could be affected if voltages that suddenly change would be applied every step of transfer during image capturing. For this reason, the intercepting film is normally not used as a power transmission film. However, the drain for serial overwriting is always activated during image capturing and deactivated for read-out after image capturing is finished. The activation and deactivation may be much slower than the operation of the electrode for charge transfer during image capturing. Moreover, since the drain is held activated during image capturing, the voltage change at the time of activation and deactivation does not affect the image quality. Consequently, the intercepting film can be used as a conductive film for transmitting drain voltages for serial overwriting, and it is unnecessary to add a new conductive film, so that a combination of three kinds of drains can be realized with a simpler structure.

A second aspect of the present invention provides an image capturing apparatus having one or a plurality of image sensors for ultrahigh-speed image capturing having the above-described characteristics. This image capturing apparatus enables ultrahigh-speed and high-performance continuous image capturing.

BEST MODE FOR CARRYING OUT THE INVENTION

First Embodiment

Figure 1:
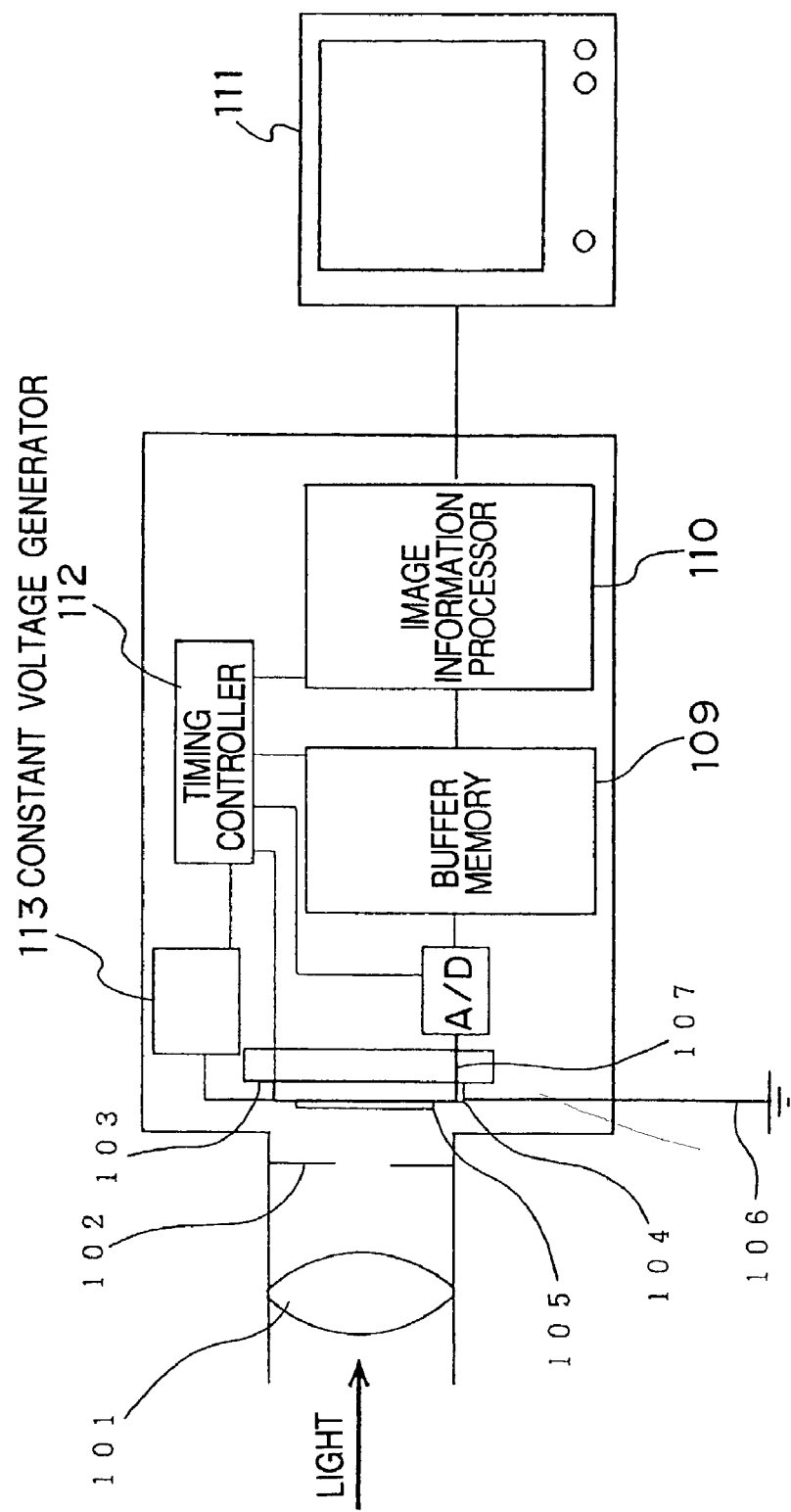
FIG. 1 is a schematic view showing an image capturing apparatus having an image sensor of a first embodiment.

FIG. 1 shows the structure of the entire image capturing apparatus. Light incident on a lens 101 passes through an external shutter 102 and form an image on an image capturing area 105 on a chip 104 of an image sensor 103 for ultrahigh-speed image capturing. Charges are generated in accordance with the intensity of the incident light during image capturing, and excessive charges generated by excessive incident light are discharged to ground through a drain wire 106. Afterimage capturing, the image information (in this case, charge) stored in the image sensor through a read-out line 107 is converted to digital information by an AD converter 108, and then stored in a buffer memory 109. Then, the image information is converted to image information of each of the continuous frames by an image information processor 110, and then output to the outside of the image capturing apparatus. This image information can be viewed as a visible image through a monitor 11.

The image capturing apparatus also has a timing controller 112 for overall control. Further, the image capturing apparatus has a constant voltage generator 113 for generating several kinds of voltages necessary for controlling the CCD image sensor.

Figure 2:
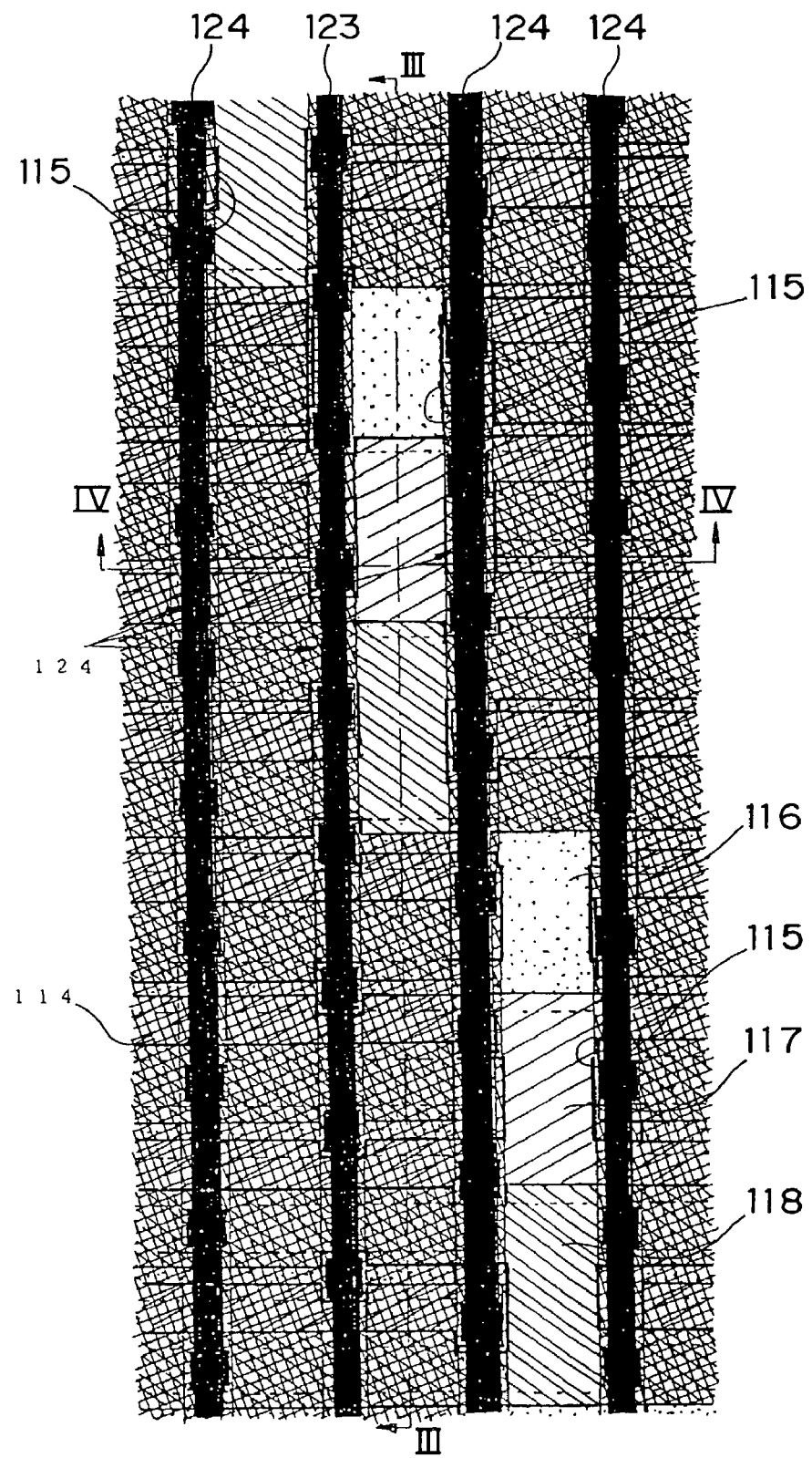
FIG. 2 is a partial front view showing an image capturing area.
Figure 3:
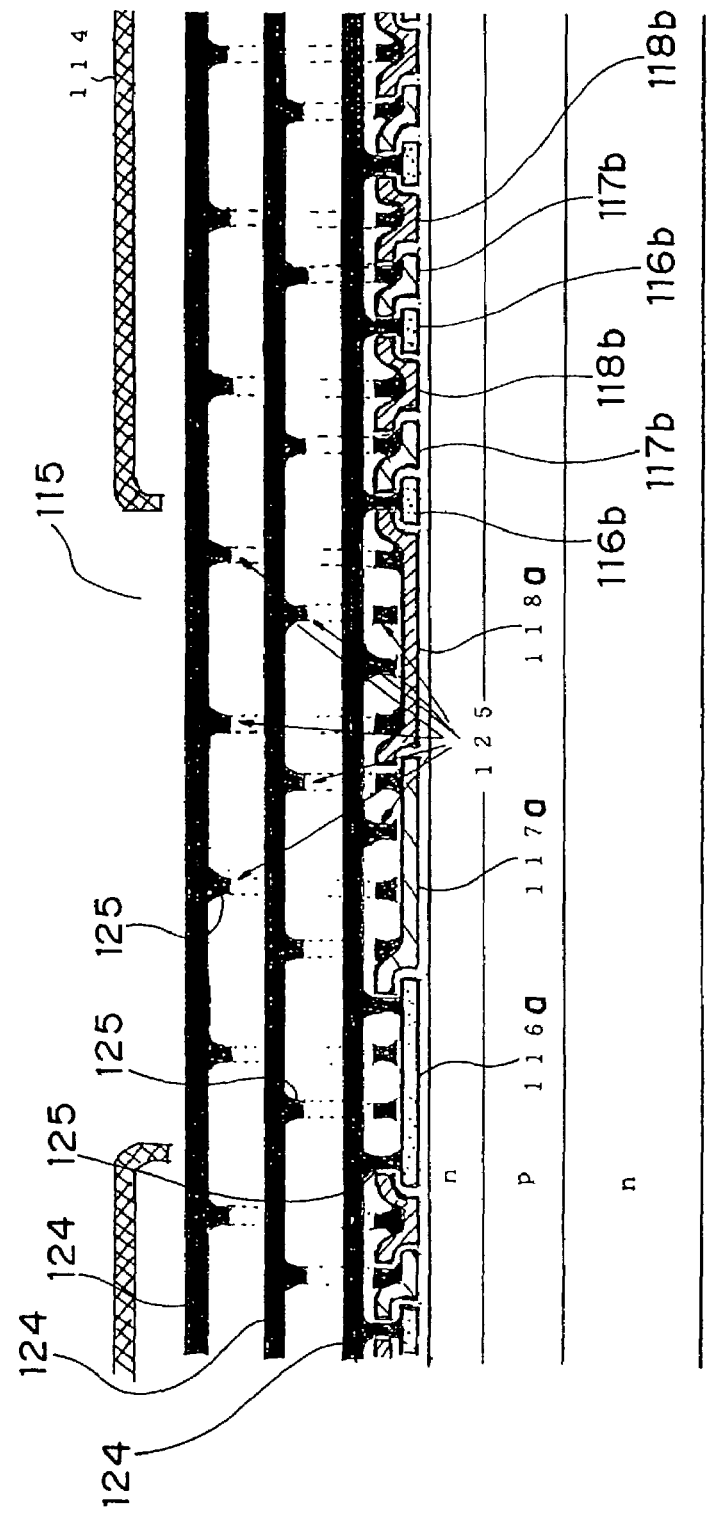
FIG. 3 is a sectional view taken on the line III—III of FIG. 2.
Figure 4:
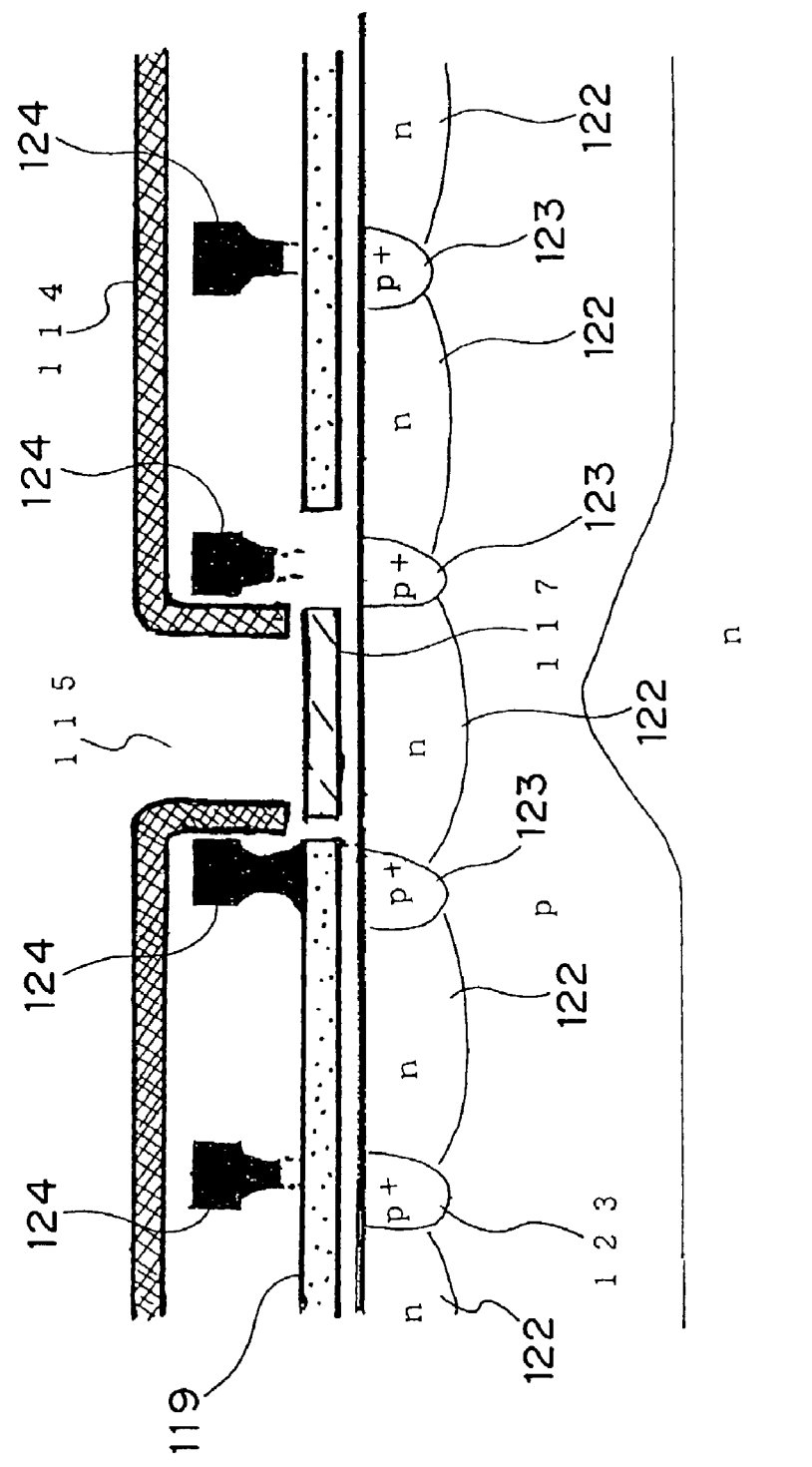
FIG. 4 is a sectional view taken on the line IV—IV of FIG. 2.

FIG. 2 shows an enlargement of a part of the image capturing area 105 of the image sensor. FIG. 3 is a cross-sectional view of a transfer path in the charge transfer direction, which shows a III—III cross section of FIG. 2. The III—III cross section passes through a window. However, tungsten wires 124 are actually situated within the same plane. FIG. 4 shows a cross section in a direction perpendicular to the transfer direction, which is a IV—IV cross section of FIG. 2.

The image capturing area is covered with an intercepting film 14 made of aluminum, and windows 115 allowing light to pass therethrough are formed.

Figure 5:
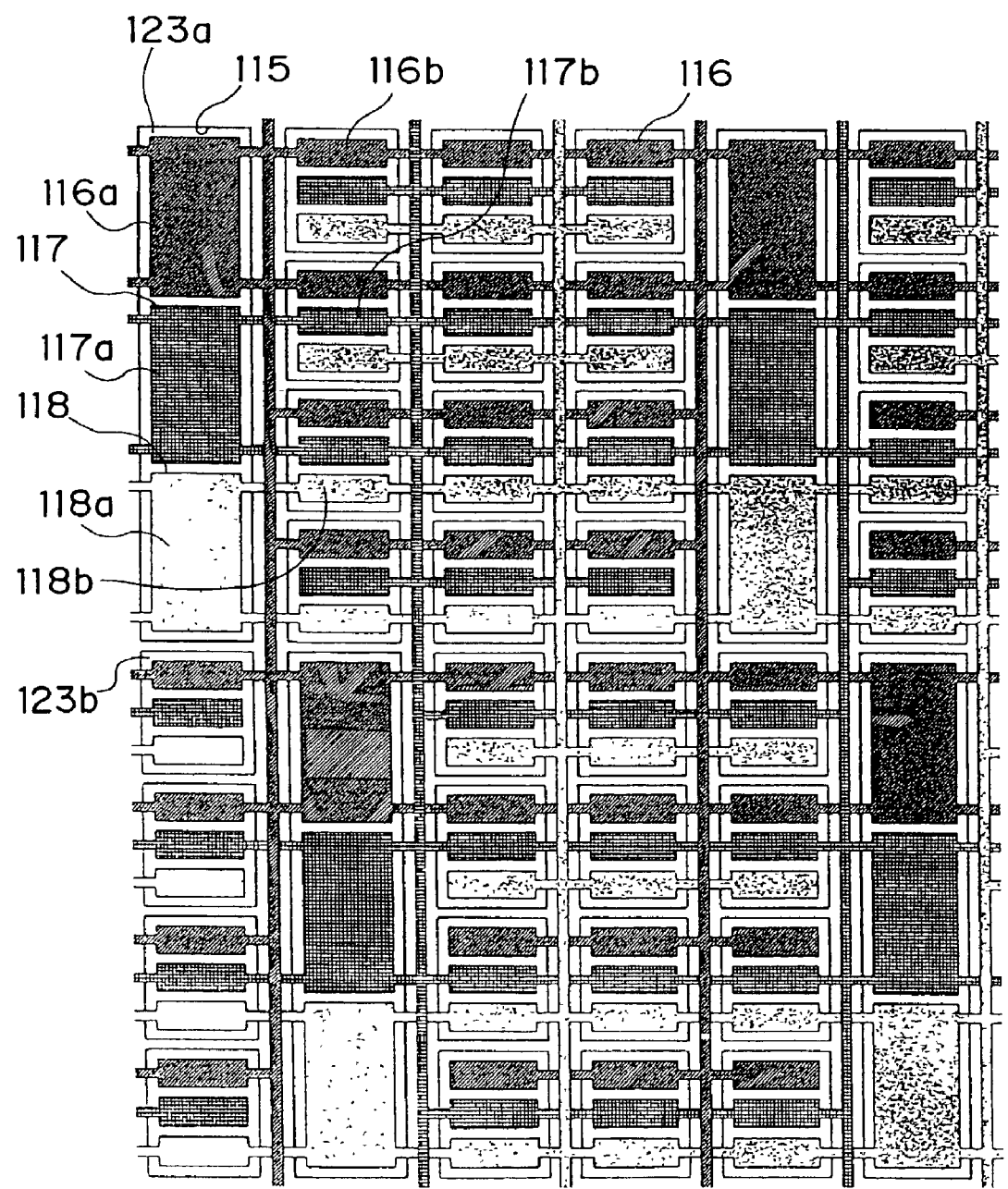
FIG. 5 is a schematic view showing the arrangement of charge transfer electrodes.

FIG. 5 conceptually shows the elongated windows 115 and charge transfer electrodes 116, 117 and 118 comprising polysilicon electrodes. In the charge transfer electrodes 116, 117 and 118, the width (the size in the charge transfer direction) of the portions 116a, 117a and 117a corresponding to each window 115 is larger than that of the portions 116b, 117b and 118b covered with the intercepting film 114. In the present embodiment, the width of the portions 116a, 117b and 117c corresponding to each window 115 is four times that of the portions 116b, 117b and 118b covered with the intercepting film 114.

FIGS. 6 to 10 concretely show the lamination structure of the image sensor.

Figure 6:
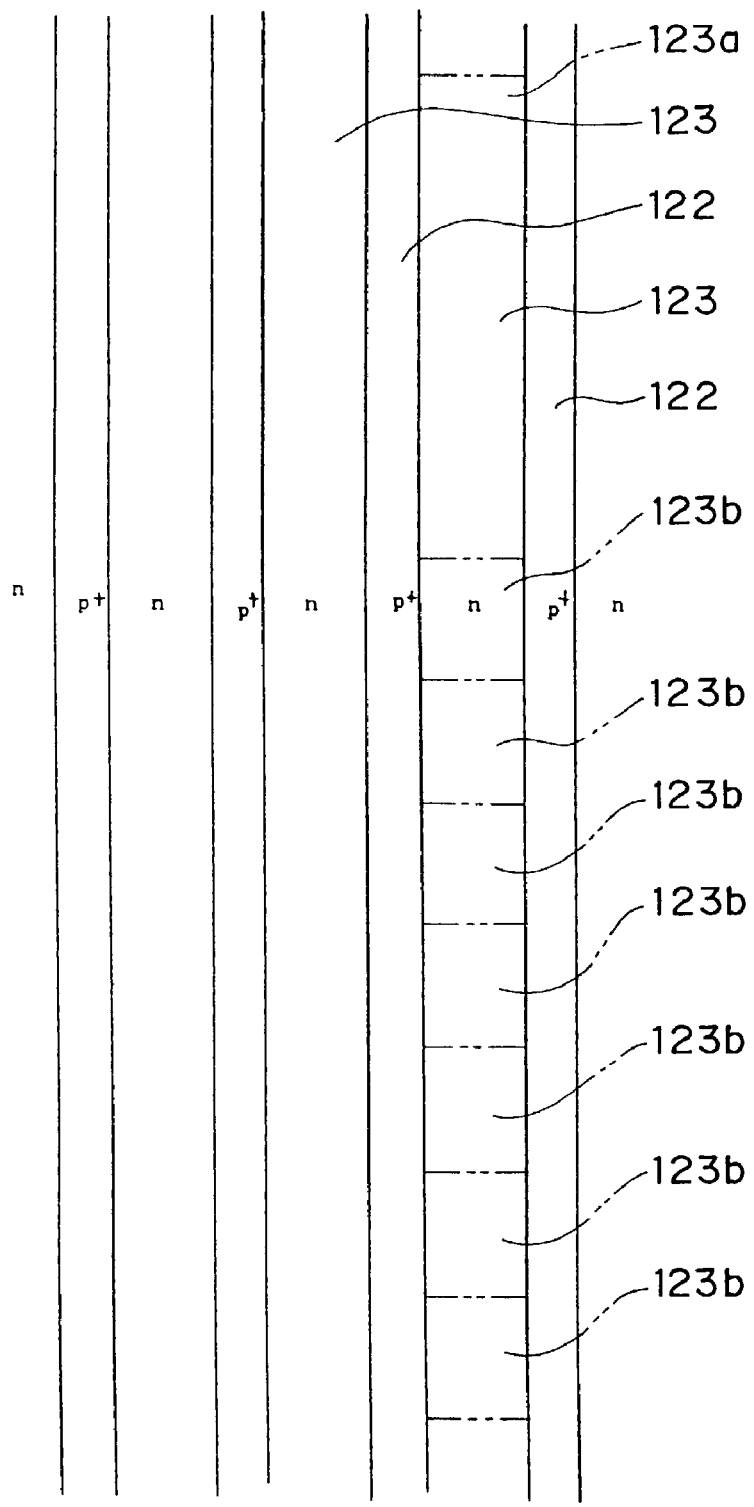
FIG. 6 is a partial enlarged front view of the surface of a substrate.

FIG. 6 shows the substrate from which the electrodes and the intercepting film are removed. On the substrate, charge transfer paths 123 (comprising n regions) and channel stops 122 (comprising p+ regions) are formed by diffusing or implanting donor ions or acceptor ions.

Figure 7:
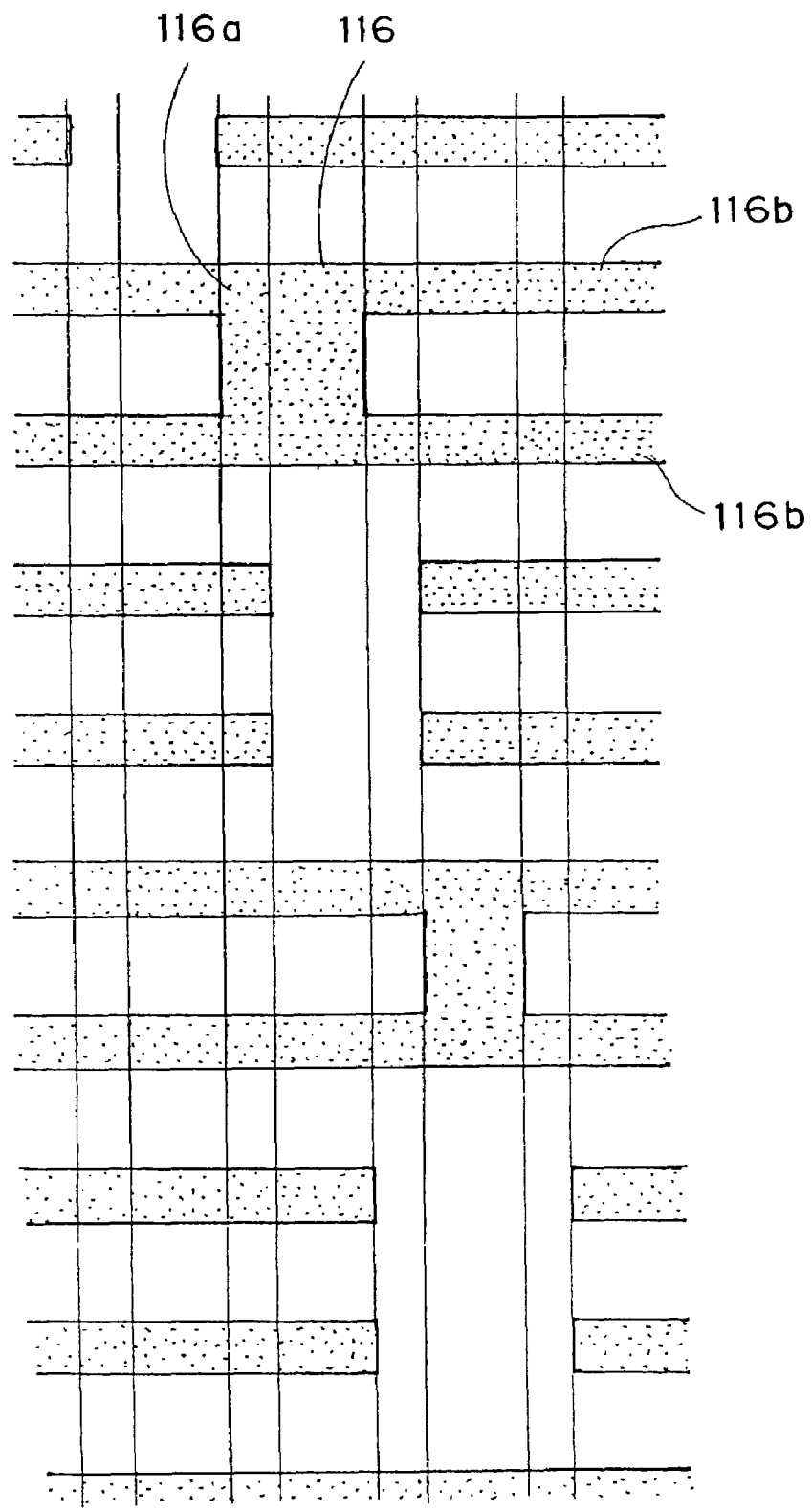
FIG. 7 is a partial enlarged front view showing a charge transfer electrode of the first layer.
Figure 8:
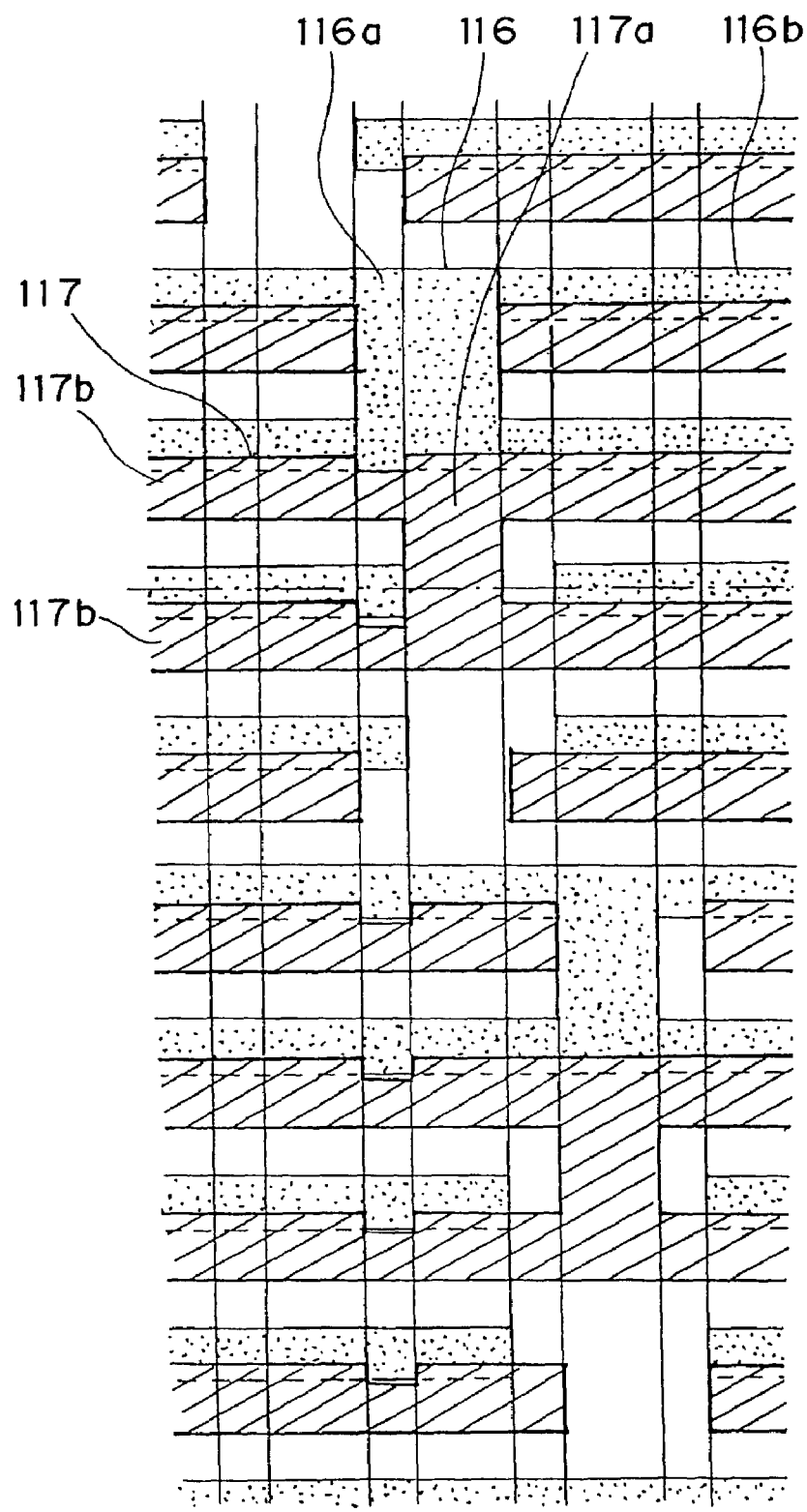
FIG. 8 is a partial enlarged front view showing charge transfer electrodes of the first and second layers.
Figure 10:
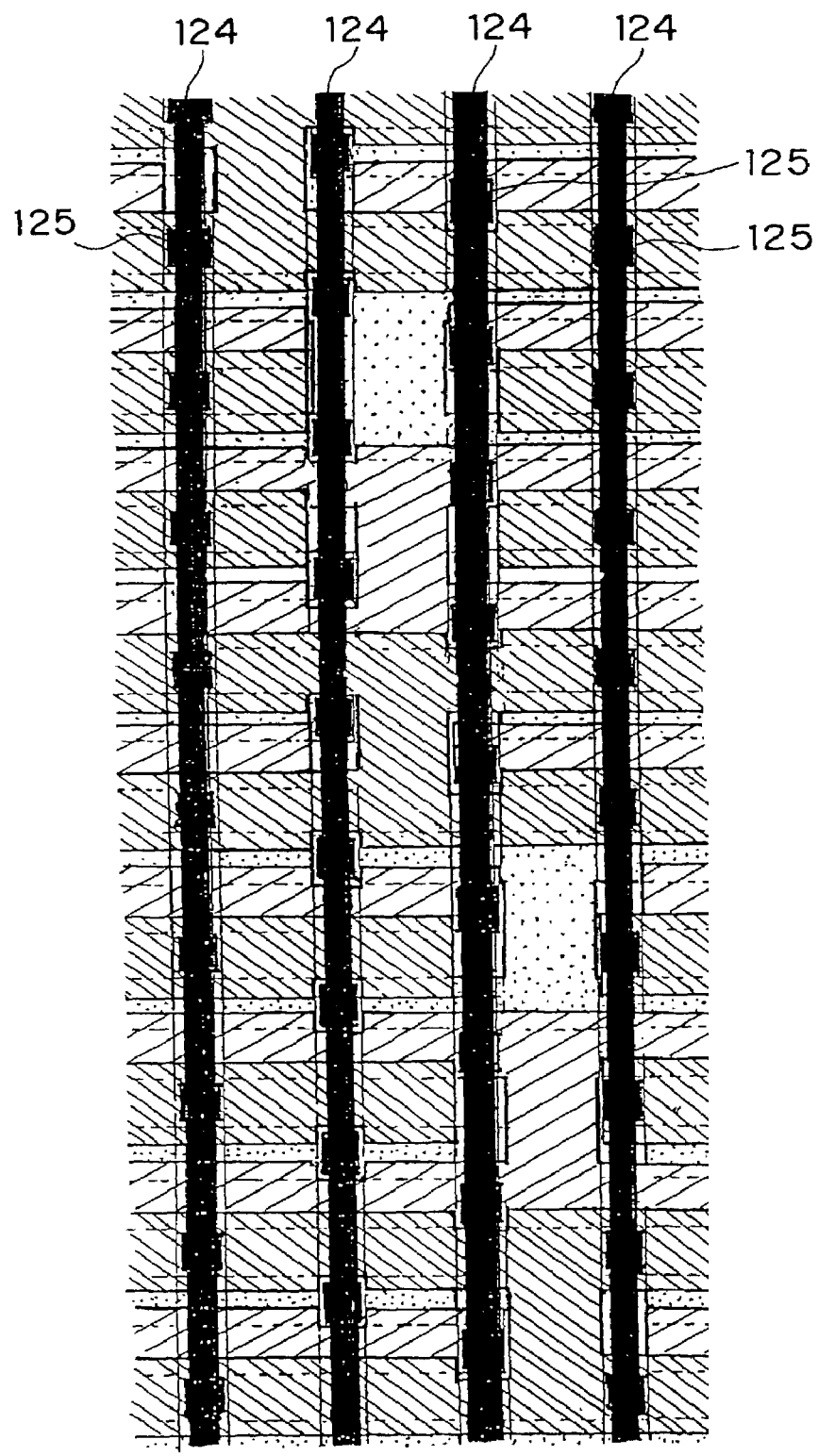
FIG. 10 is a partial enlarged front view showing the charge transfer electrodes of the first, second, and third layers and tungsten wires.
Figure 9:
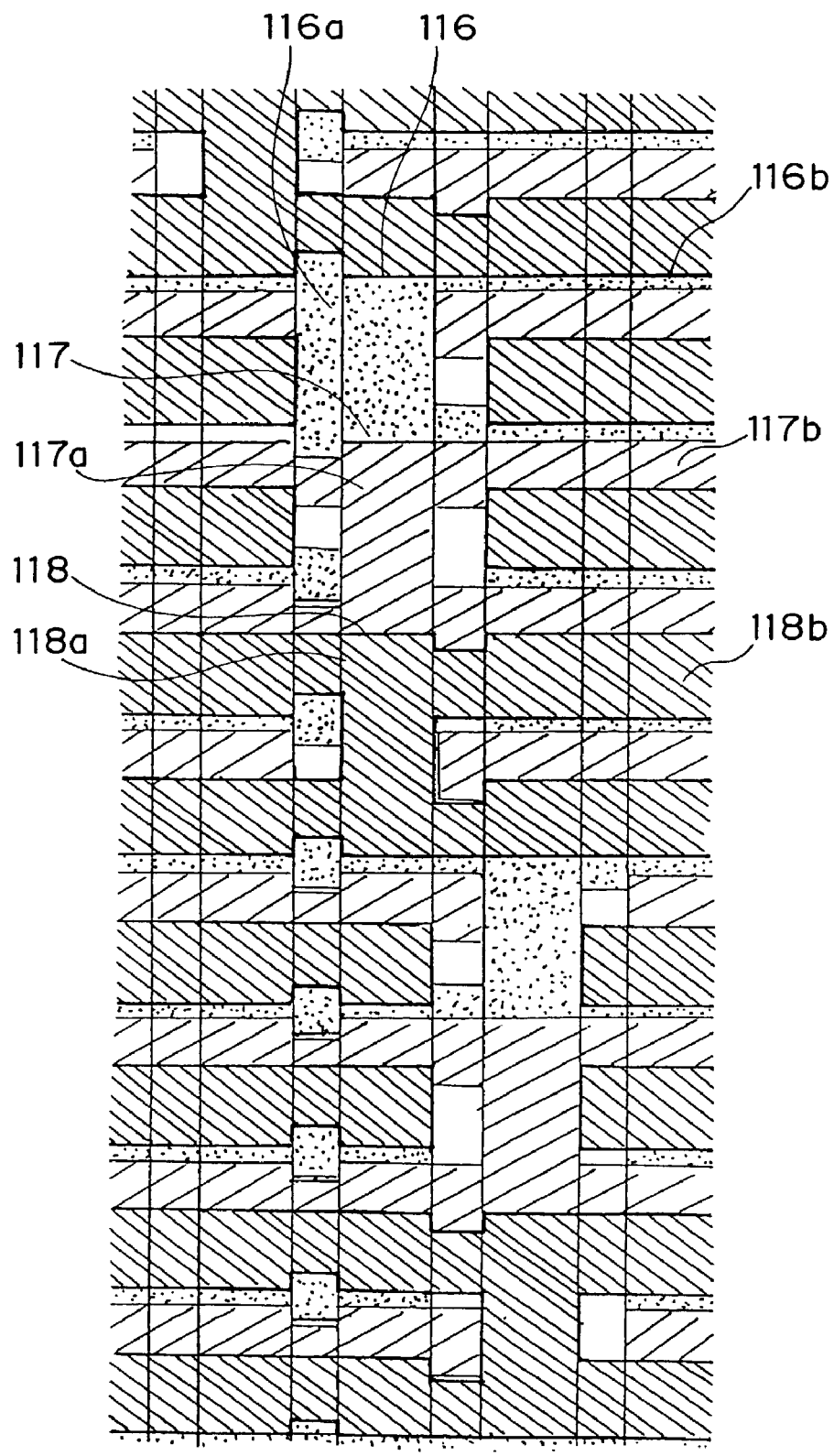
FIG. 9 is a partial enlarged front view showing charge transfer electrodes of the first, second, and third layers.

FIGS. 7, 8 and 9 show statuses where the charge transfer electrodes 116, 117 and 118 of the first, the second and the third layers are successively laminated with insulator films inserted between each of them. FIG. 10 shows a stasus where the tungsten wires 124 for transmitting charge transfer voltages to the charge transfer electrodes 116, 117 and 118 are further provided. The tungsten wires 124 situated in a upper layer and the charge transfer electrodes 116, 117 and 118 situated in lower layers are electrically interconnected in the vertical direction through contact points 125. The above-described FIG. 2 shows a status where the intercepting film 114 is further provided on the tungsten wires 124.

Charges corresponding to the intensity of the light incident through the windows 115 are generated at elements 123a of the charge transfer paths 123 corresponding to the windows 115 (see FIGS. 5 and 6). By changing the voltage applied to the charge transfer electrodes 116, 117 and 118, the charges are transferred to CCD elements 123b situated in the light intercepted portions (see FIGS. 5 and 6) and stored as image information. By repeating this operation, twelve continuous images are stored at the point of time when the first image information reaches the CCD element immediately above other window immediately below the window. At this time, the external shutter 102 is closed. Consequently, no new charges are generated.

By performing a normal charge transfer operation of the CCD transfer paths 123 under this condition, the stored charges (image information) are transferred downward one after another, and transmitted one by one to an output circuit (not shown) through a horizontal CCD (not shown) provided in a lower part outside the image capturing area. The image information is converted to digital information by the AD converter 108 outside the image sensor, stored in the buffer memory 109, and then processed by the image information processor 110.

Since this image sensor for ultrahigh-speed image capturing of the frame transfer type, it has a simpler basic structure than the interline transfer type. Moreover, since each of the charge transfer electrodes 116, 117, and 118 has larger size in a charge transfer direction at portions 116a, 117a, and 118a corresponding to each of the windows than those at portions 116b, 117b, and 118b covered with the intercepting film 114, the aperture efficiently is high. Further, charges can be transferred with a large pitch, so that the charge transfer rate at the windows 115 or the image capturing speed is high. In addition, since the number of elements 123a of the CCD transfer path 123 at each window 115 is one, the number of elements 123b necessary for storing the charge corresponding to one image is one, so that a multiplicity of frames of images can be stored in the image sensor. As described above, in the image sensor for ultrahigh-speed image capturing of the present embodiment, the basic structure is simple, the aperture efficiency is comparatively high, image capturing can be performed at a higher speed, and a large number of continuous frames can be captured.

Second Embodiment

Figure 11:
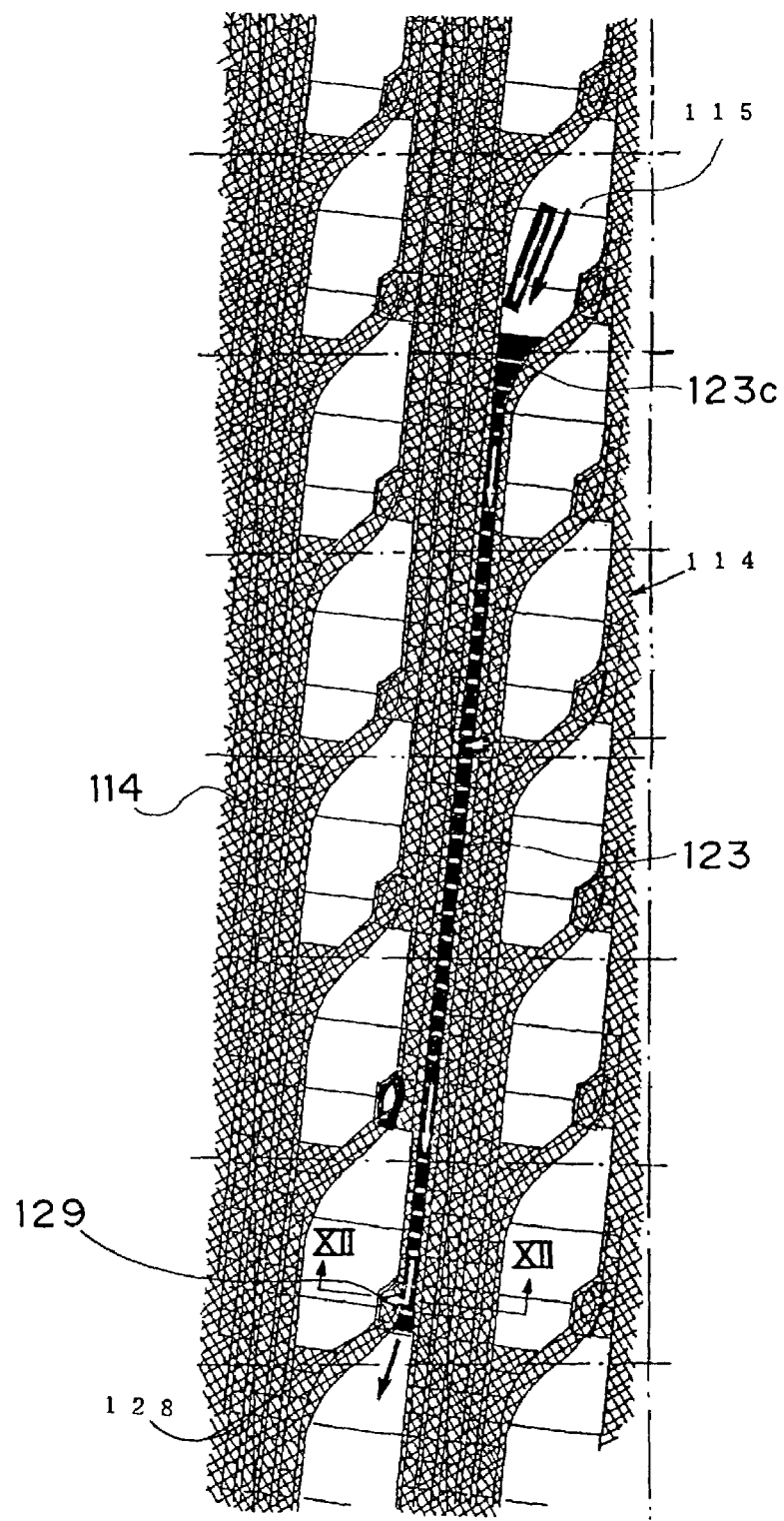
FIG. 11 is a partial enlarged front view showing the image capturing area of an image sensor of a second embodiment.
Figure 12:
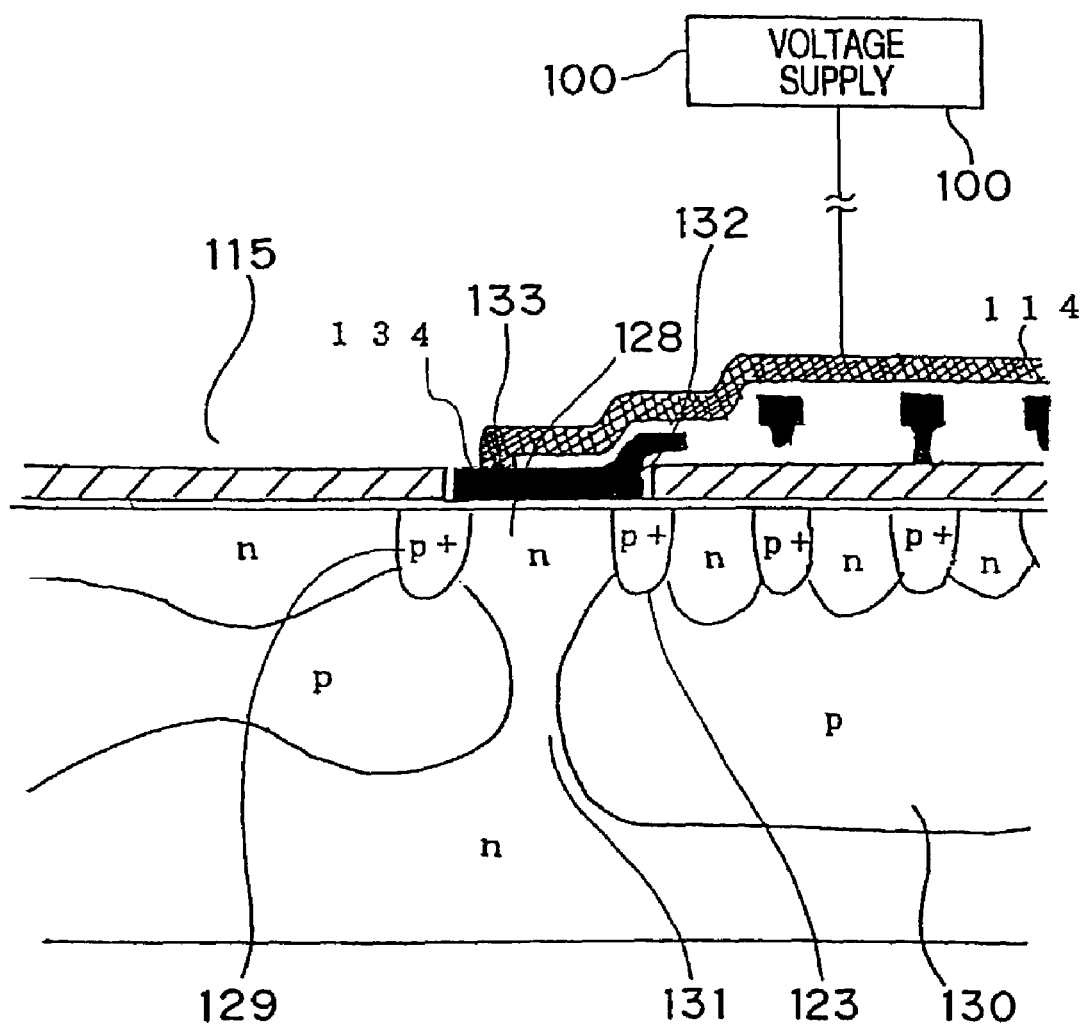
FIG. 12 is a sectional view taken on the line XII—XII of FIG. 11.

In the image sensor for ultrahigh-speed image capturing of a second embodiment of the present invention shown in FIGS. 11 and 12, the size of the charge transfer paths 123 in a direction perpendicular to the charge transfer direction is increased at the windows 115. In correspondence therewith, a gently curved portion 123c is provided on each charge transfer path 123. Further, a drain 128 for serial overwriting is provided on a right side of the charge transfer path 123 immediately above each window 115.

Moreover, the windows 115 are each fringed with a tungsten layer 132 situated one layer below the aluminum intercepting film 114. This construction is reducing a smearing phenomenon caused by light or photoelectrons entering peripheral charge transfer paths 123 from the windows 115.

In the image sensor of the present embodiment, since the aperture efficiency is high compared to the first embodiment, the sensitivity to light is dramatically improved. Additionally, since serial overwriting is possible, it is extremely easy to stop capturing in exact timing with the occurrence of a phenomenon in ultrahigh-speed image capturing.

Moreover, the curved portion 123c assures a sufficient space for disposing the drain 128 for overwriting read-out. Consequently, a channel stop region 129 of a sufficient length can be formed in a gap from the window on the left side of the drain region, so that even if a high voltage is applied to the drain electrode 132, the voltage can be prevented from adversely affecting the charge transfer efficiency at the window 115 on the left in the figure.

The basic difference from the first embodiment other than the high aperture efficiency is that the drain 128 for serial overwriting is provided. Therefore, this will be described.

In addition to the drain 128 for serial overwriting, a normal vertical drain is provided on the lower surface of each window 115 so as to perform as an overflow drain when the voltage applied to the chip rear surface is low and function as a simultaneous discharging drain when a high voltage is applied. Description of this is omitted because it is a frequently used structure.

Now, the drain 128 for serial overwriting will be described in detail.

As shown in FIG. 12, a p-region 130 is provided in the substrate so that the charges are prevented from escaping to the rear surface by the potential barrier of the p-region 130. A charge outflow path, so to speak, a hole 131 comprising an n-region is formed below the drain 128, and the charges entering the drain 128 are all automatically discharged from the chip rear surface to the outside of the image sensor.

In overflow drains, instead of forming a complete electronic hole, the portion is a weak p-region so that when charges are excessively stored, the potential barrier is decreased (in other words, the electronic hole is formed) due to the excessive charge storage and the charges are discharged from the rear surface. When a high voltage is applied from the rear surface, an electronic hole is also formed in the potential barrier and the charges are simultaneously discharged.

As shown in FIG. 12, the drain electrode 132 is provided on the upper surface of the drain 128 for serial overwriting. At the time of serial overwriting, a high voltage is applied to the drain electrode 132 by a voltage source 100, and the potential barrier of the channel stop region 129 in a gap from the charge transfer path 123 is decreased to thereby move the charges to the side of the drain 128. Since a high voltage is also applied to the drain 128 at this time, a weak p-region may be provided also on the bottom of the drain for discharging charges. In this case, a hole is also formed in the potential barrier on the bottom by the voltage applied to the drain electrode 132. Specifically, at the contact point 133, a voltage is applied from the uppermost aluminum intercepting film 114 to the drain electrode 132 through a light intercepting layer 134 made of tungsten below the film 114.

The other functions and operations of the second embodiment are the same as those of the first embodiment. Specifically, the charge generated at each window 115 is transmitted to the charge transfer path 123, and when reaching the drain 128, automatically discharged to the outside of the sensor. Therefore, as shown by the bold line in FIG. 11, the charge transfer path 123 performs as the image information storage region, and forty continuous frames of latest images are always stored in the region.

When a target phenomenon to be capture occurs, the serial overwriting operation is stopped as well as the external shutter is closed, and then the application of the drain voltage is stopped so that the charges can flow on the side of the charge transfer path 123. After that, the accumulated image information is read out to the outside of the image sensor with leisure.

Since it is necessary for the serial overwriting drain only to be activated immediately before image capturing and deactivated immediately after image capturing as described above, it is unnecessary to suddenly activate and deactivate it during image capturing. Consequently, even if a voltage is transmitted through the intercepting film 114 with a large electric capacity, the delay in voltage transfer time does not cause any problem. Moreover, since no sudden voltage change occurs during image capturing, the image quality is not affected. As described above, the intercepting film can be used as one of the power supply layers, so that it is unnecessary to newly add a power supply wire in an upper part of the image sensor although an important function, serial overwriting, is added.

Third Embodiment

Figure 13:
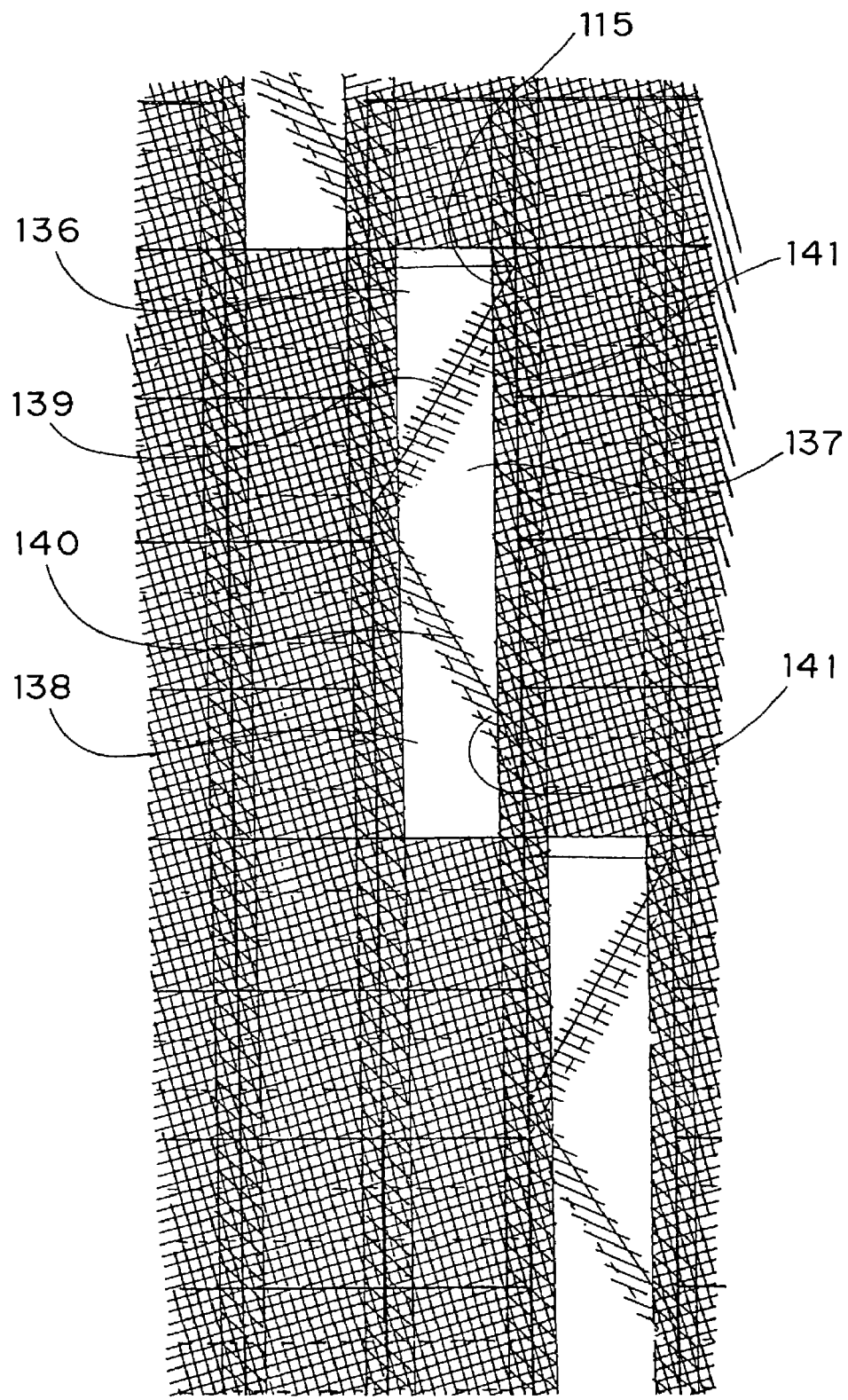
FIG. 13 is a partial enlarged front view showing the image capturing area of an image sensor of a third embodiment.

FIG. 13 shows a third embodiment of the present invention. In the third embodiment, portions 136, 137 and 138 of the charge transfer electrode corresponding to the window 115 are not perpendicular but slanted to the charge transfer direction so as to be wedged-shaped. Therefore, the length of the sides of the portions 136, 137 and 138 where an electronic field fringe is caused, that is, the length of overlapping portions 139 and 140 of the electrodes situated at upper and lower portions thereof (on the upstream and the downstream sides in the charge transfer direction) them are extremely long. Consequently, the ratio of the area of a region 141 where the field fringe effect is caused shown by the oblique lines in the figure with respect to the area of the window 115 is high.

Figure 14:
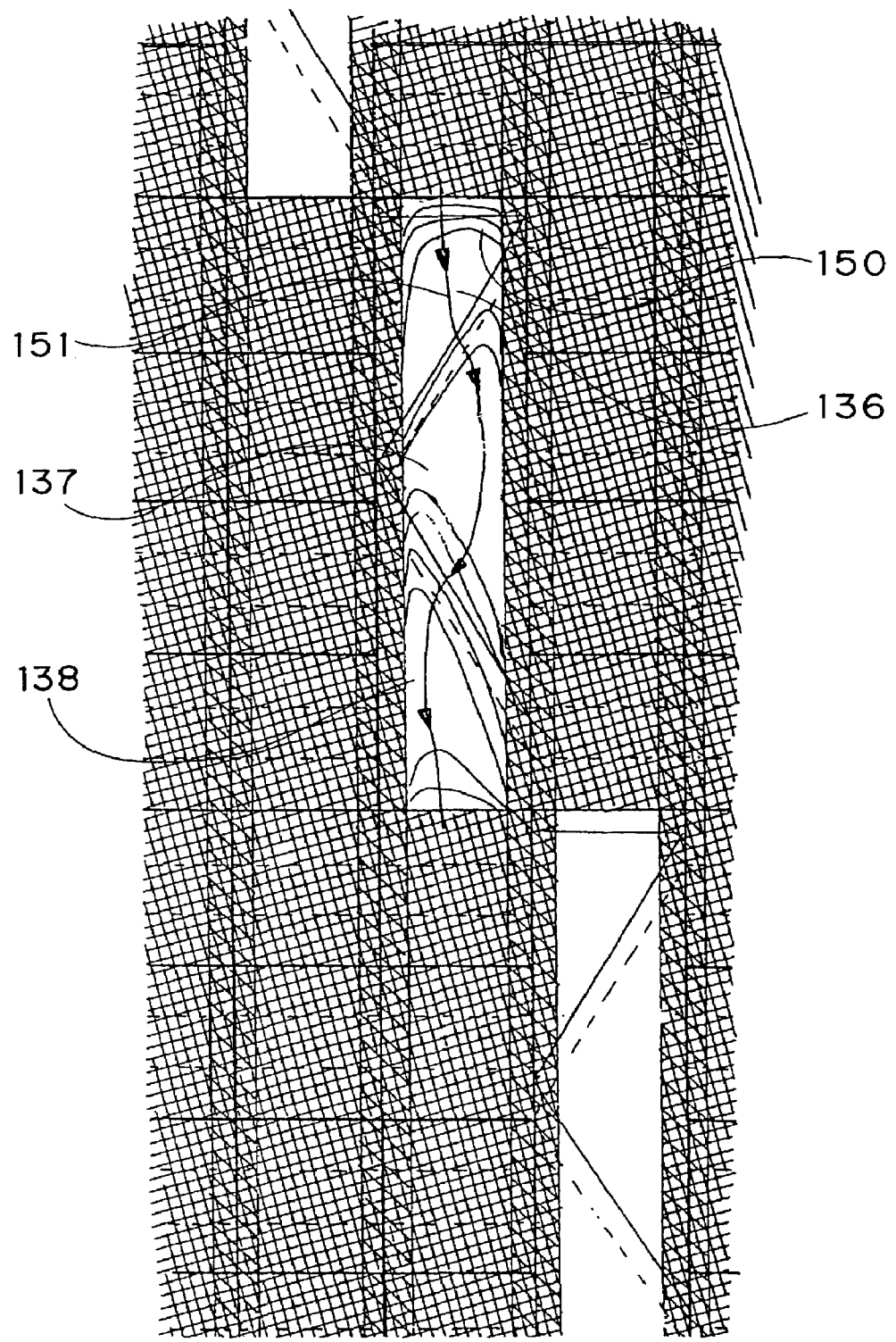
FIG. 14 is a partial enlarged front view showing the potential and the charge transfer path in the third embodiment.

FIG. 14 shows the potential 150 and the charge transfer direction 151 in the present embodiment. As is apparent from FIG. 14, in the present embodiment, the portion of the charge transfer path within the window 15 where a potential is flat has decreased length, so that the charge transfer rate is increased and the probability of incomplete charge transfer due to a local potential pocket significantly decreases.

Fourth Embodiment

Figure 15:
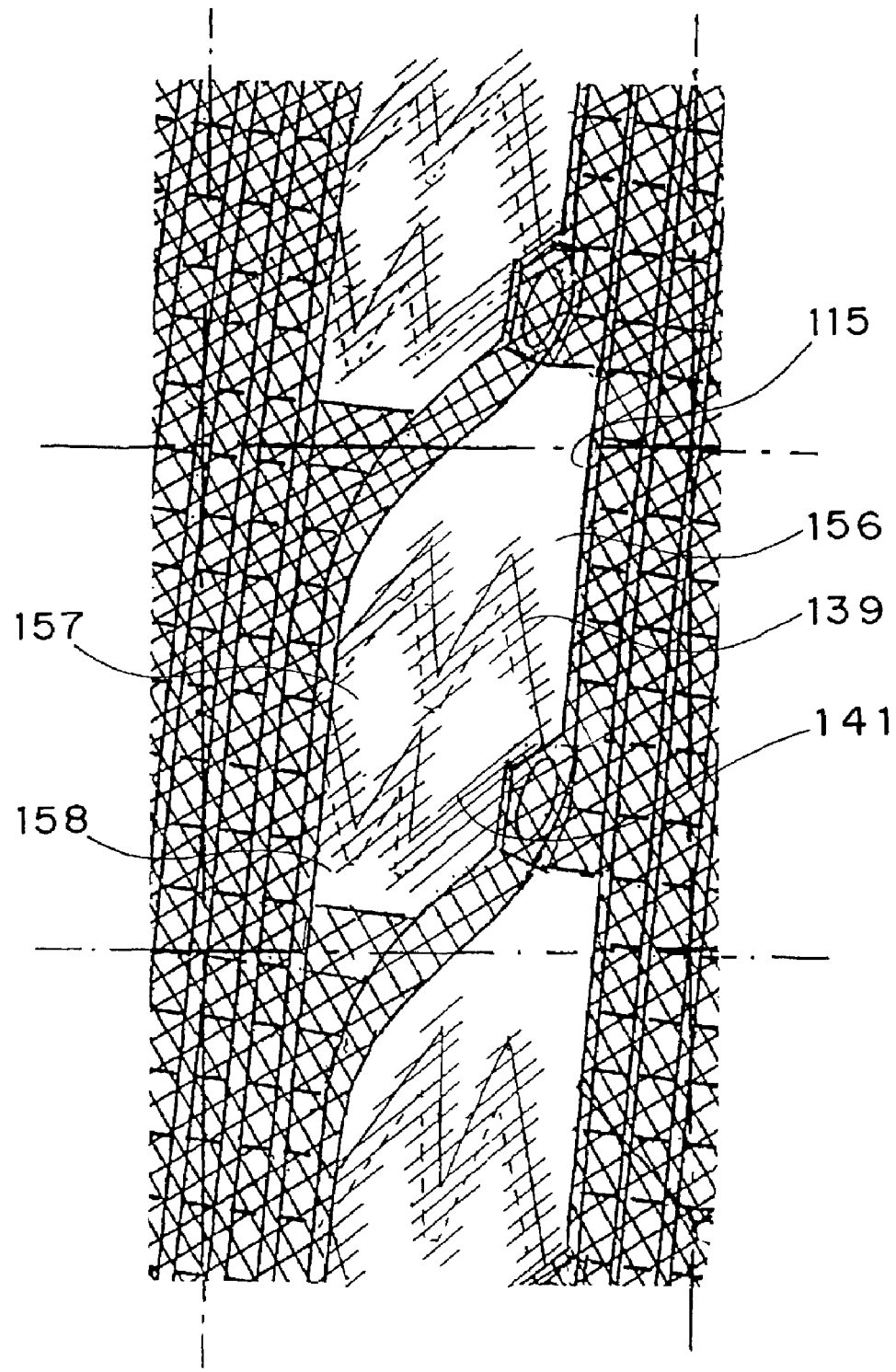
FIG. 15 is a partial enlarged front view showing the image capturing area of an image sensor of a fourth embodiment.

A fourth embodiment of the present invention shown in FIG. 15 is different from the second embodiment in the shapes of portions 156, 157 and 158 of the charge transfer electrode corresponding to the window 115. Specifically, overlapping portions 139 and 140 of the electrodes on the upstream and the downstream sides in the charge transfer direction are respectively M-shaped and W-shaped. Therefore, compared to the second embodiment in which the overlapping portions of the electrode are linear, the length of the overlapping portions 139 and 140 is extremely long and the ratio of the area of the field fringe caused region 141 with respect to the area of the window 115 is extremely high, so that the field fringe effect effectually works.

Figure 16:
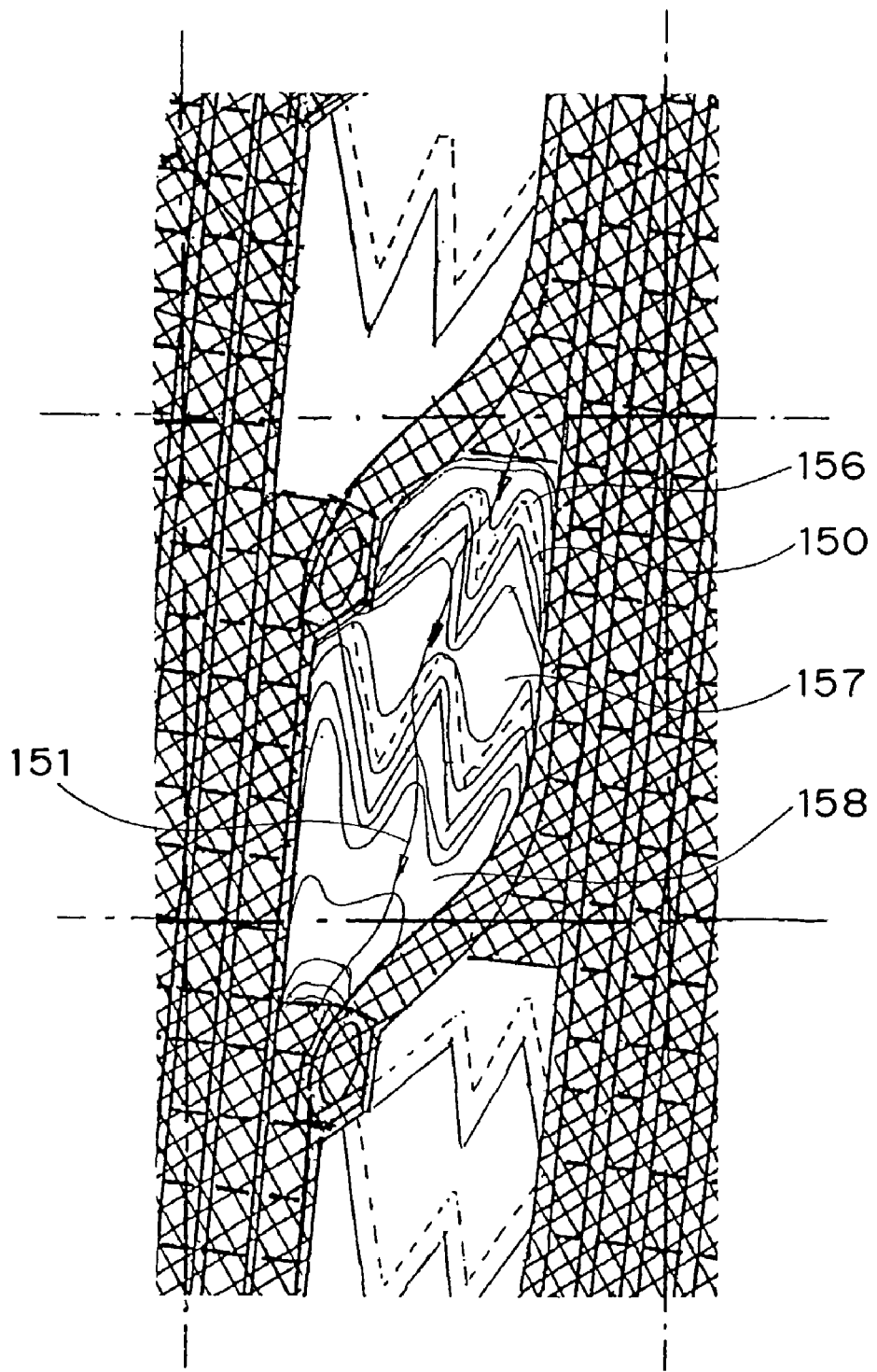
FIG. 16 is a partial enlarged view showing the potential and the charge transfer path in the fourth embodiment.
Figure 17:
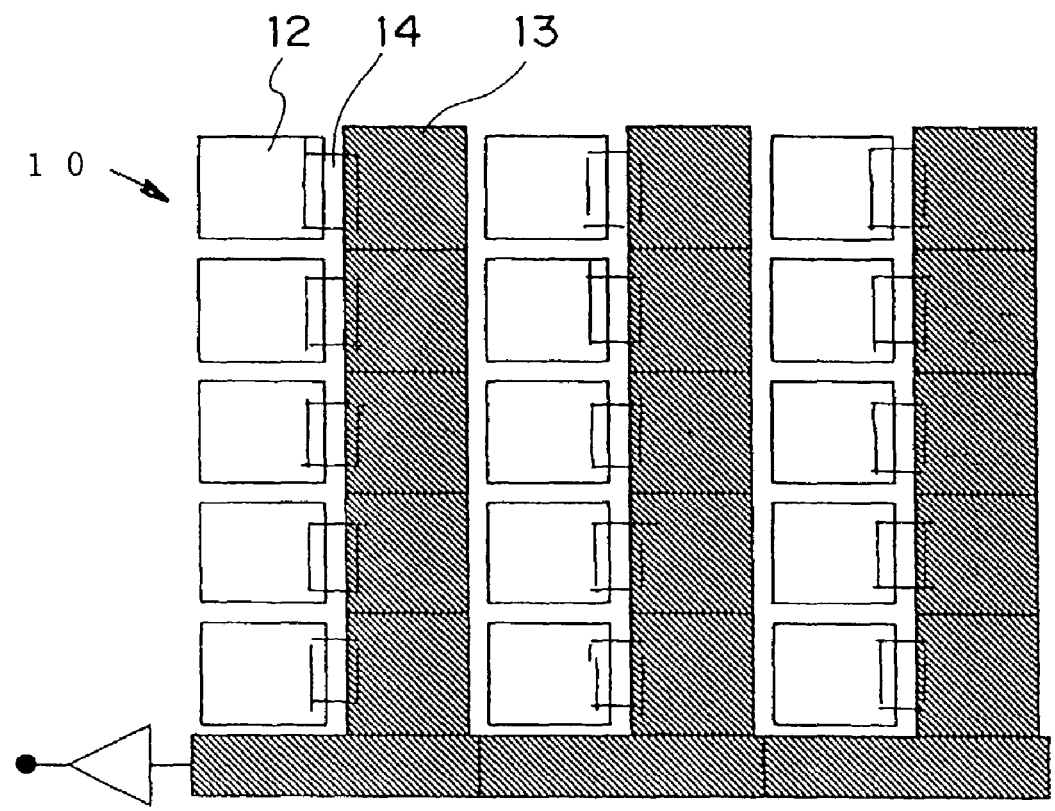
FIG. 17 is a schematic view showing the interline transfer CCD image sensor.
Figure 18:
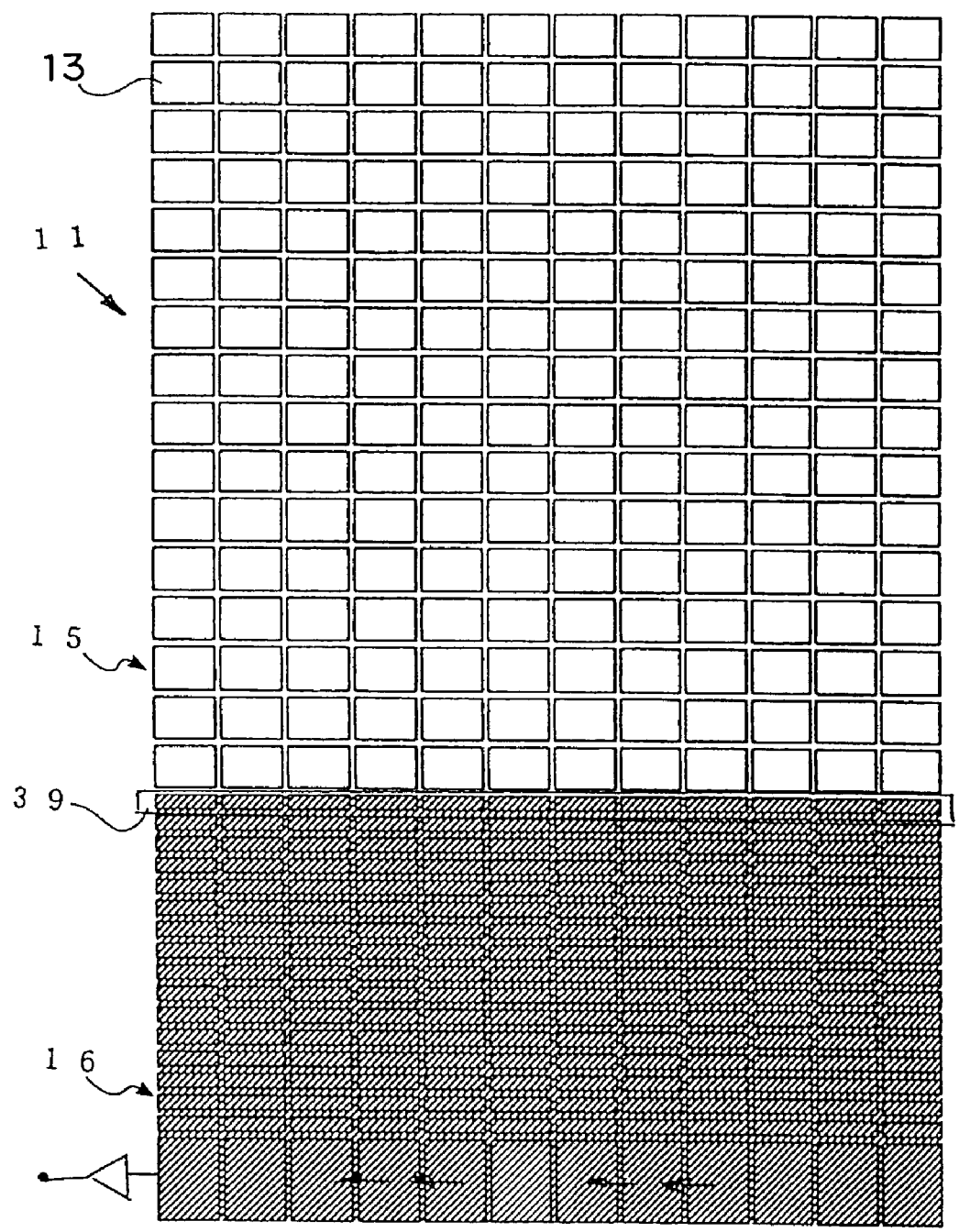
FIG. 18 is a schematic view showing the frame transfer CCD image sensor.
Figure 19:
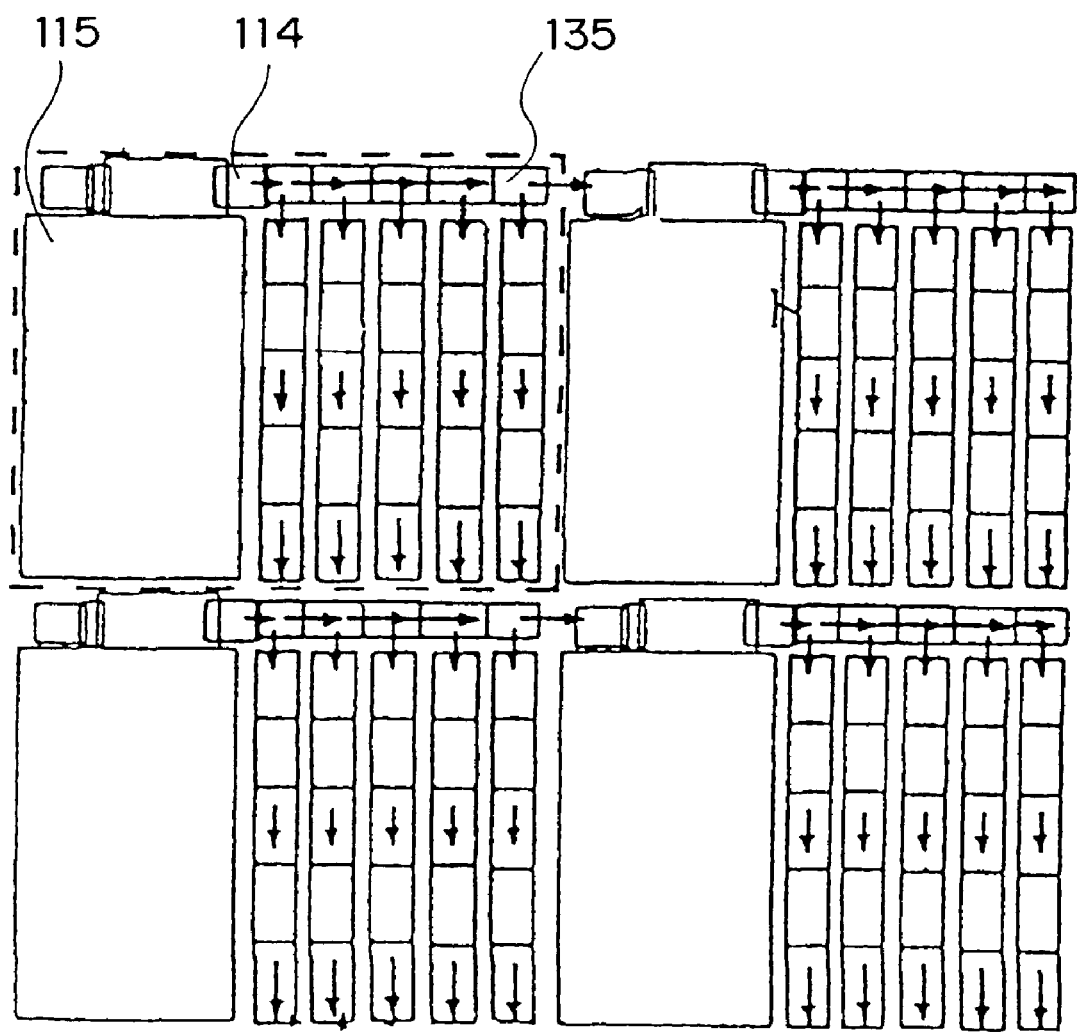
FIG. 19 is a schematic view showing the ISIS image sensor.
Figure 20:
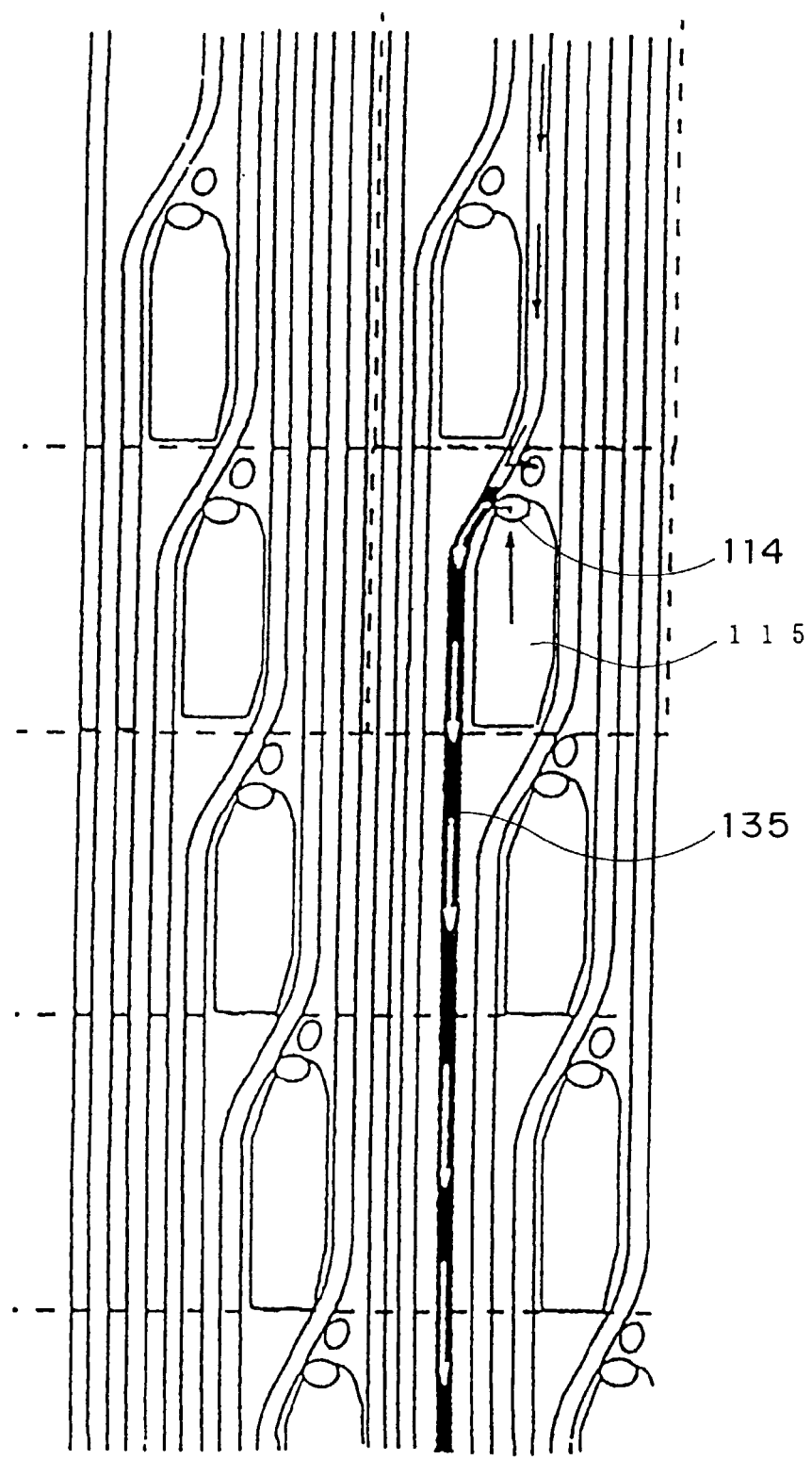
FIG. 20 is a schematic view showing another ISIS image sensor.
Figure 21:
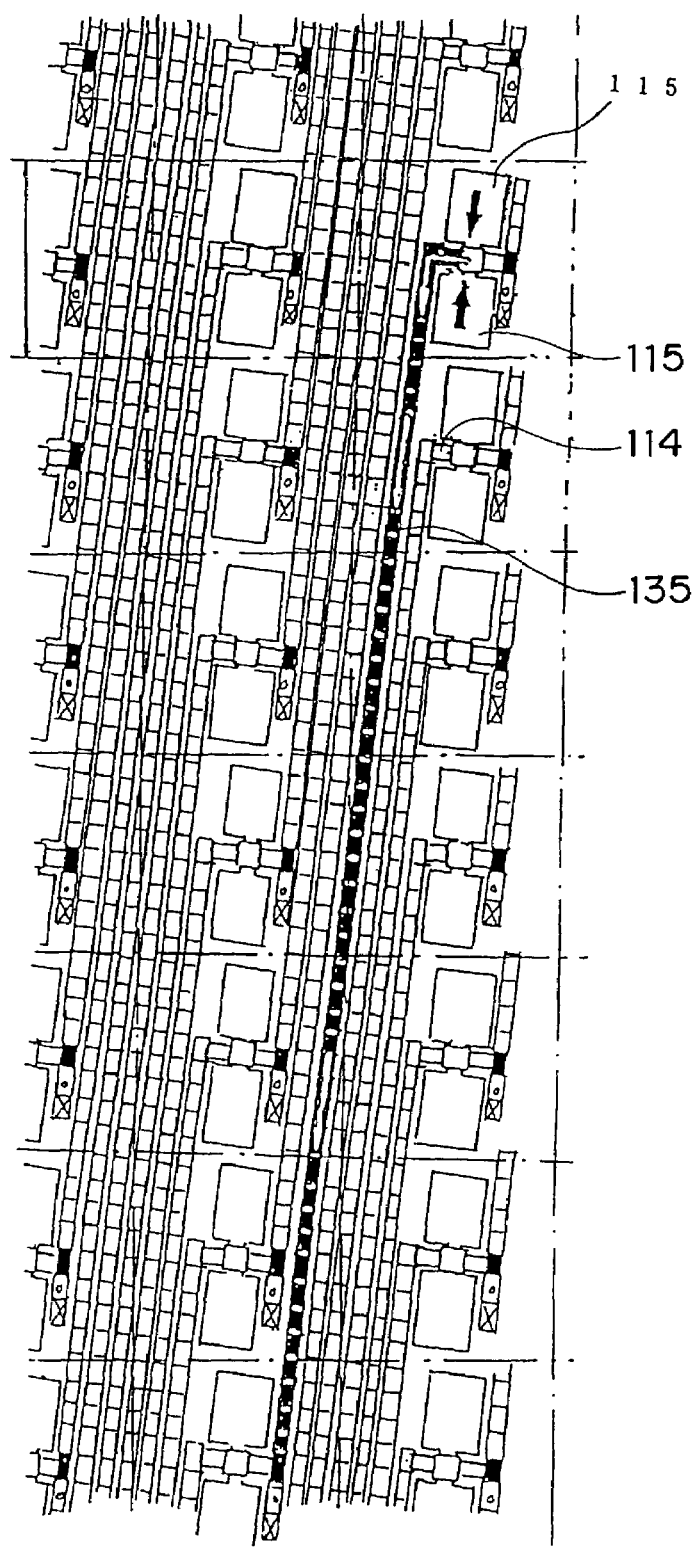
FIG. 21 is a schematic view showing the ISIS having the CCD image information storage portion and the MOS amplification read-out circuit for each pixel.
Figure 22:
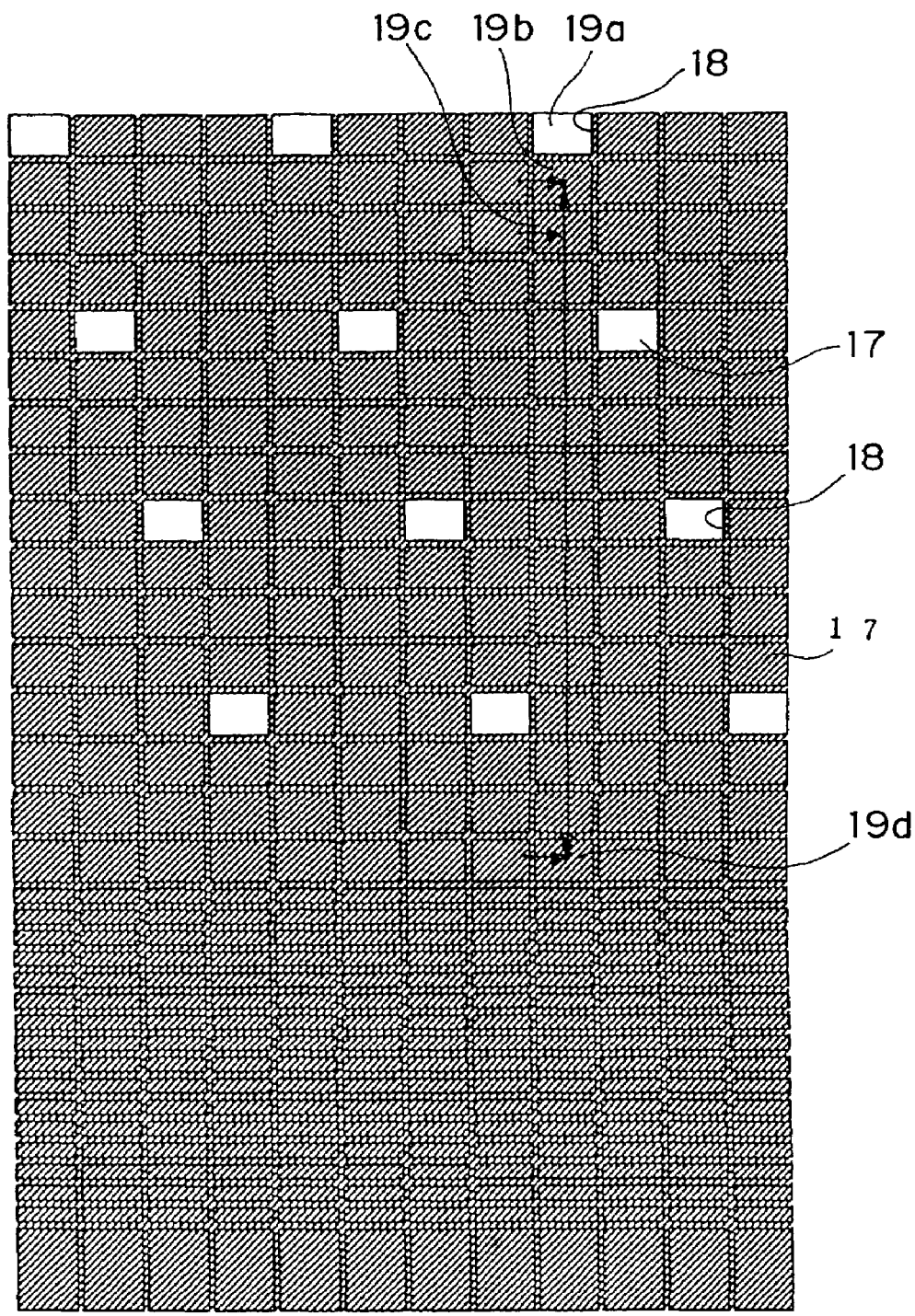
FIGS. 22 to 25 are schematic views showing the frame transfer CCD type ISISs.
Figure 23:
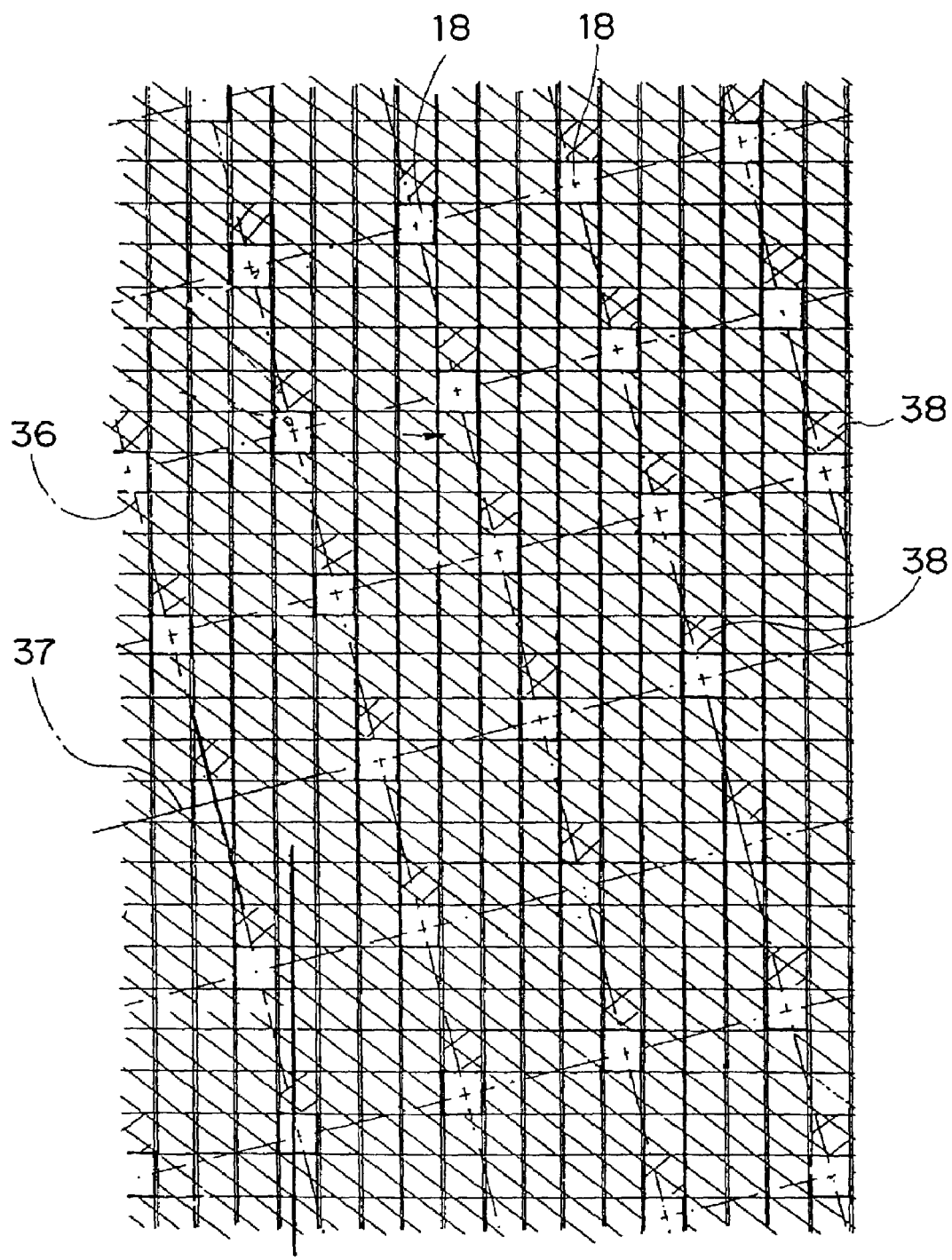
Figure 24:
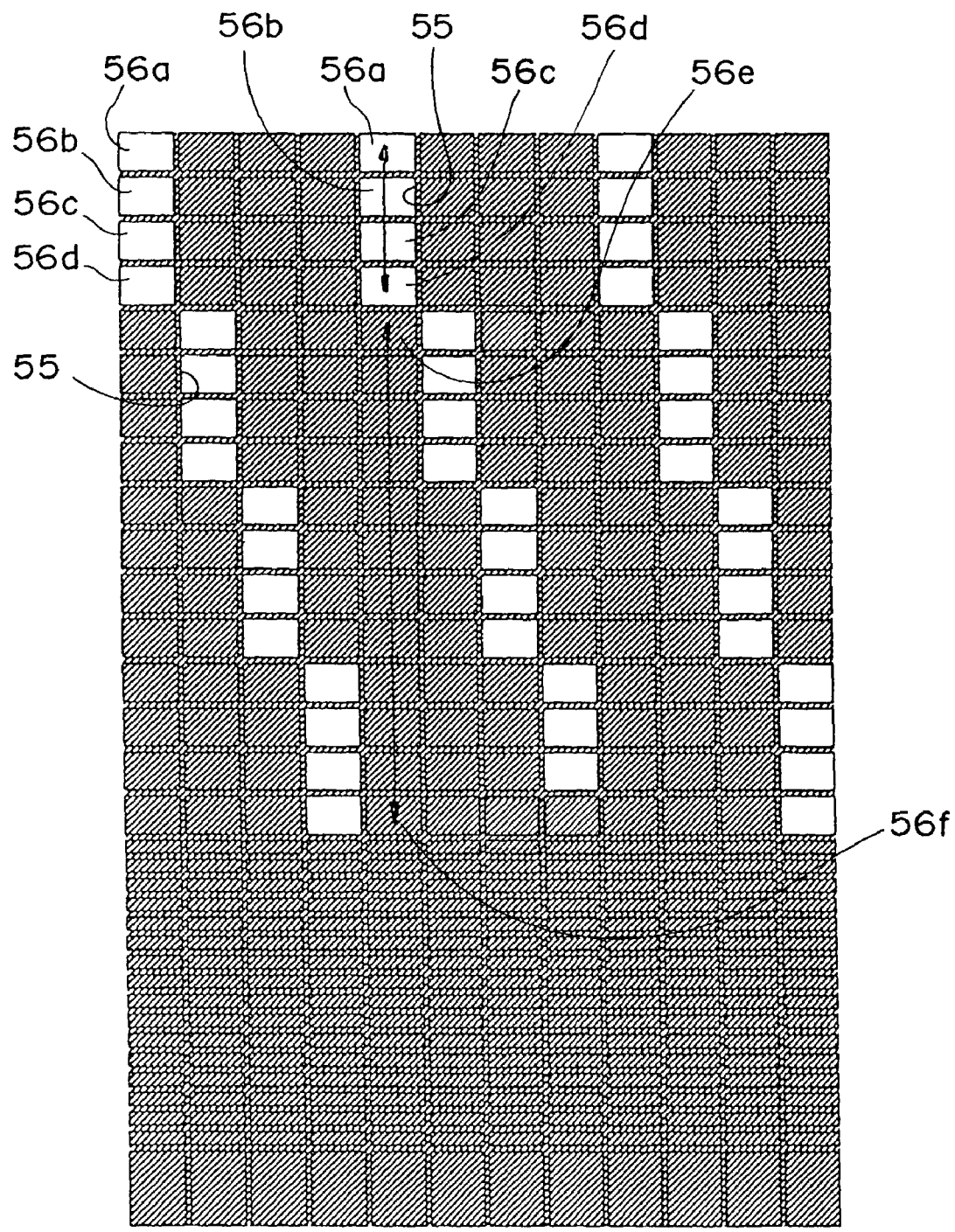
Figure 25:
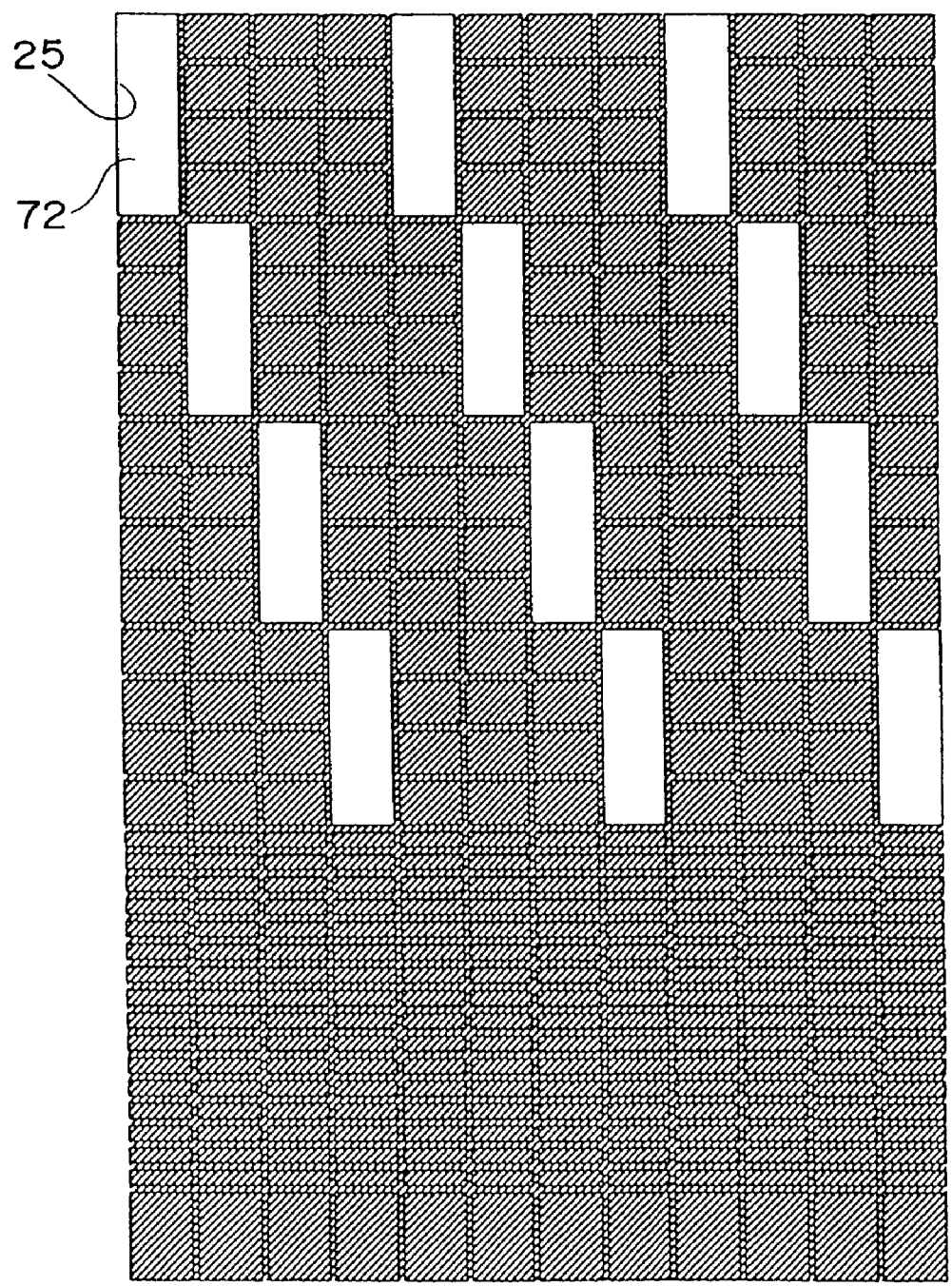
Figure 26:
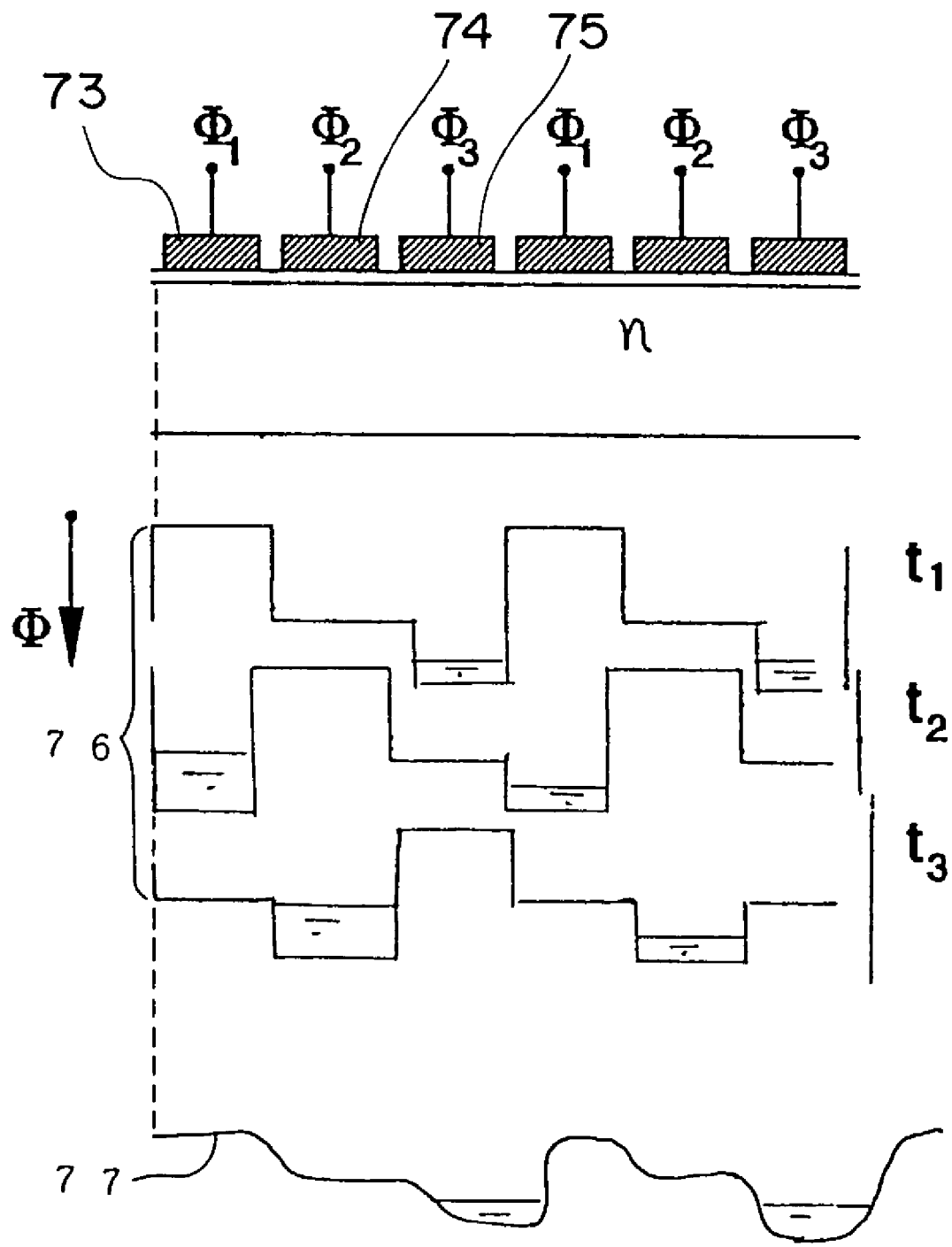
FIG. 26 is a schematic view showing the structure and the principle of the three-phase-driven CCD.

FIG. 16 shows the potential 150 and the charge transfer direction 151 in the present embodiment. As is apparent from FIG. 16, charges are transferred while spreading and approaching in an X shape.

The present invention is not limited to the above-described embodiments, but various modifications are possible.

For example, an overflow drain and an electronic shutter function based on simultaneous discharging may be provided, which is common in image sensors.

The transfer path in the windows may be originally provided with a slight potential gradient to assist the field fringe effect. For this, the impurity concentration may be slightly increased in the transfer direction in the windows.

To form color images, a color filter array may be mounted. To increase the substantial aperture efficiency, a micro cylindrical lens may be mounted on each window. The on-chip micro lens not only improves the substantial aperture efficiency but also has an effect of converging light to a central portion of the window and an effect of preventing light or photoelectrons from diffusing from a peripheral portion of the window to the transfer path adjoining the window.

The incident light is not limited to visible light. It may be different electromagnetic waves such as ultraviolet rays, near-infrared rays or weak X rays, or may be particle beams such as electron waves. However, in the case of weak X rays, electron flows and the like, it is necessary to overlay an intercepting film (not shown) made of a material that intercepts them. Since ultraviolet rays are absorbed by polysilicon, it is necessary that the polysilicon electrode be extremely thin or that the charge drive electrode be made of a material transmitting ultraviolet rays.

The metal layers are not necessarily made of aluminum or tungsten. The intercepting layer may be made of tungsten, the charge transfer drive voltage may be transmitted through an aluminum wire, and both may be made of the same material.

The electrode configuration for improving the field fringe effect is not limited to the ones of the third and the fourth embodiments. In other words, it is minimum requirement that the upstream and/or the downstream sides in the charge transfer direction of the portions of the charge transfer electrodes corresponding to the windows should intersect at an angle not perpendicular to a direction in which the charge transfer paths extend. Specifically, the electrodes may be wedge-shaped, wavy or comb-shaped, so that the overlapping portions of the electrodes are bent lines or curved lines of the opposite phase or the same phase.

A thin n-region strip may be provided in the channel strap regions surrounding the windows so that light and photoelectrons diffusing from the periphery of the window to the outside are converged and discharged from the drain.

What is claimed is:

1. An image sensor for ultrahigh-speed image capturing comprising:
    a plurality of charge transfer paths each constituted by a charge coupled device having a plurality of elements and disposed parallel to each other;
    a plurality of charge transfer electrodes intersecting the charge transfer paths and provided for each element of the charge transfer paths;
    an intercepting film covering the charge transfer paths and said charge transfer electrodes so as to intercept an incident ray; and
    a plurality of windows provided in the intercepting film and allowing the incident ray to pass therethrough,
    wherein a charge corresponding to an intensity of the incident ray is generated at the element of the charge transfer path corresponding to each window, and the generated charge is transferred on the charge transfer path by voltages applied from the charge transfer electrodes, and
    wherein each of the charge transfer electrodes has a larger size in a charge transfer direction at portions corresponding to the windows than that at portions covered with the intercepting film.

2. An image sensor for ultrahigh-speed image capturing according to claim 1, wherein the portions of each charge transfer electrode corresponding to the windows have upstream and/or downstream sides in the charge transfer direction, the upstream and/or downstream sides intersecting with respect to a direction in which the charge transfer paths extend at angles other than perpendicular to the direction.

3. An image sensor for ultrahigh-speed image capturing according to claim 1 or 2, wherein the intercepting film is made of a conductive material, and
    wherein the image sensor further comprises:
    discharging means provided for each charge transfer path, the number of said discharging means being the same as the number of the windows through which the charge transfer path passes; and
    a voltage supply for supplying a drive voltage to the discharging means through the intercepting film, and
    wherein the drive voltage is supplied from the voltage supply to the discharging means to hold said discharging means activated during image capturing, whereas the supply of the drive voltage from said voltage applying means to said discharging means is stopped to hold said discharging means deactivated while the image capturing is stopped.

4. An image capturing apparatus having the image sensor for ultrahigh-speed image capturing according to claim 1 or 2.

* * * * *